(12) United States Patent
Kaneda et al.

(10) Patent No.: US 9,780,043 B2
(45) Date of Patent: Oct. 3, 2017

(54) WIRING BOARD, SEMICONDUCTOR PACKAGE, AND SEMICONDUCTOR DEVICE

(71) Applicant: SHINKO ELECTRIC INDUSTRIES CO., LTD., Nagano-shi, Nagano (JP)

(72) Inventors: Wataru Kaneda, Nagano (JP); Noriyoshi Shimizu, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/372,913

(22) Filed: Dec. 8, 2016

(65) Prior Publication Data

US 2017/0170130 A1   Jun. 15, 2017

(30) Foreign Application Priority Data

Dec. 10, 2015   (JP) ................................ 2015-241424

(51) Int. Cl.

| | | |
|---|---|---|
| *H01L 23/00* | (2006.01) | |
| *H01L 21/48* | (2006.01) | |
| *H01L 23/31* | (2006.01) | |
| *H01L 23/498* | (2006.01) | |

(52) U.S. Cl.
CPC .......... *H01L 23/562* (2013.01); *H01L 21/486* (2013.01); *H01L 21/4857* (2013.01); *H01L 23/3114* (2013.01); *H01L 23/49822* (2013.01); *H01L 23/49827* (2013.01); *H01L 23/49838* (2013.01); *H01L 24/16* (2013.01); *H01L 23/3128* (2013.01); *H01L 2224/16227* (2013.01); *H01L 2924/3512* (2013.01)

(58) Field of Classification Search
CPC . H01L 23/562; H01L 21/4857; H01L 21/486; H01L 23/3114; H01L 23/49822; H01L 23/49827; H01L 23/49838; H01L 24/16; H01L 23/49833
See application file for complete search history.

(56) References Cited

U.S. PATENT DOCUMENTS

2013/0264100 A1* 10/2013 Horiuchi .............. H05K 3/4644
                                                         174/251
2015/0179560 A1   6/2015 Arisaka et al.

FOREIGN PATENT DOCUMENTS

JP         5662551       12/2014

* cited by examiner

*Primary Examiner* — Walter H Swanson
(74) *Attorney, Agent, or Firm* — Rankin, Hill & Clark LLP

(57) ABSTRACT

A wiring board includes: a first insulating layer which is made of an insulating resin containing a thermosetting resin as a main component; a recess portion formed in an upper surface of the first insulating a layer; a first wiring layer formed in the recess portion and comprising an upper surface exposed from the first insulating layer; a via wiring penetrating the first insulating layer in a thickness direction thereof and comprising an upper end surface exposed from the first insulating layer; a second wiring layer formed on the upper surface of the first insulating layer to contact the upper end surface of the via wiring and the upper surface of the first wiring layer; and a second insulating layer which is made of an insulating resin containing a photosensitive resin as a main component and which is formed on the upper surface of the first insulating layer.

8 Claims, 17 Drawing Sheets

WIRING BOARD, SEMICONDUCTOR PACKAGE, AND SEMICONDUCTOR DEVICE

This application claims priority from Japanese Patent Application No. 2015-241424, filed on Dec. 10, 2015, the entire contents of which are herein incorporated by reference.

BACKGROUND

1. Technical Field

The present disclosure relates to a wiring board, a semiconductor package, and a semiconductor device.

2. Description of the Related Art

In the related art, a so-called POP (Package On Package) structure has been known as a structure for stacking semiconductor packages on each other. There has been proposed a technique capable of increasing the density of each wiring layer in a semiconductor device having such a POP structure (e.g. see Japanese Patent No. 5662551 (JP5662551B1)). For example, a semiconductor package has been proposed as a lower-side semiconductor package. In the semiconductor package, high-density wiring layers including insulating layers in each of which a photosensitive resin is layered are formed on low-density wiring layers including insulating layers in each of which a thermosetting resin is layered, and a semiconductor chip is flip-chip mounted on pads formed in an uppermost one of the high-density wiring layers. In this type of semiconductor device, POP connection pads are formed in the uppermost high-density wiring layer, and an upper-side semiconductor package is stacked and bonded on the connection pads.

In the aforementioned semiconductor device, the POP connection pads are formed on the photosensitive resin which is mechanically brittle. Therefore, when an external force is applied to the connection pads in order to stack and bond the upper-side semiconductor package on the lower-side semiconductor package in the semiconductor device, resin fracture such as cracking is apt to occur in the photosensitive resin which receives the load imposed on the connection pads.

SUMMARY

According to one or more aspects of the present disclosure, there is provided a wiring board. The wiring board comprises:

a first insulating layer which is made of an insulating resin containing a thermosetting resin as a main component, a recess portion formed in an upper surface of the first insulating layer;

a first wiring layer formed in the recess portion and comprising an upper surface exposed from the first insulating layer;

a via wiring penetrating the first insulating layer in a thickness direction thereof and comprising an upper end surface exposed from the first insulating layer;

a second wiring layer formed on the upper surface of the first insulating layer to contact the upper end surface of the via wiring and the upper surface of the first wiring layer; and a second insulating layer which is made of an insulating resin containing a photosensitive resin as a main component and which is formed on the upper surface of the first insulating layer to cover at least a portion of the second wiring layer.

DETAILED DESCRIPTION

Embodiments will be described below with reference to the accompanying drawings, incidentally, for convenience' sake, a portion regarded as a characteristic may be enlarged and shown in the accompanying drawings in order to make the characteristic easy to understand but dimension ratios etc. of respective constituent elements are not always exactly the same as practical ones. In addition, in sectional views, in order to make sectional structures of respective members easy to understand, hatchings of some of the members are replaced by matt patterns and shown, and others of the members are not hatched. Incidentally, in description of the invention, "plan view" means a view of a subject seen from a vertical direction (illustrated up/down direction) of FIG. 1 etc., and "planar shape" means a shape of the subject seen from the vertical direction of FIG. 1 etc.

First Embodiment

A first embodiment Twill be described below in accordance with FIG. 1, FIG. 2, FIGS. 3A to 3D, FIGS. 4A to 4D, FIGS. 5A to 5D, FIGS. 6A to 6D, FIGS. 7A to 7C, FIGS. 8A to 8C, FIGS. 9A to 9C, FIGS. 10A and 10B, FIGS. 11A and 11B, FIGS. 12A and 12B, FIG. 13 and FIGS. 14A and 14B.

Figure 1:
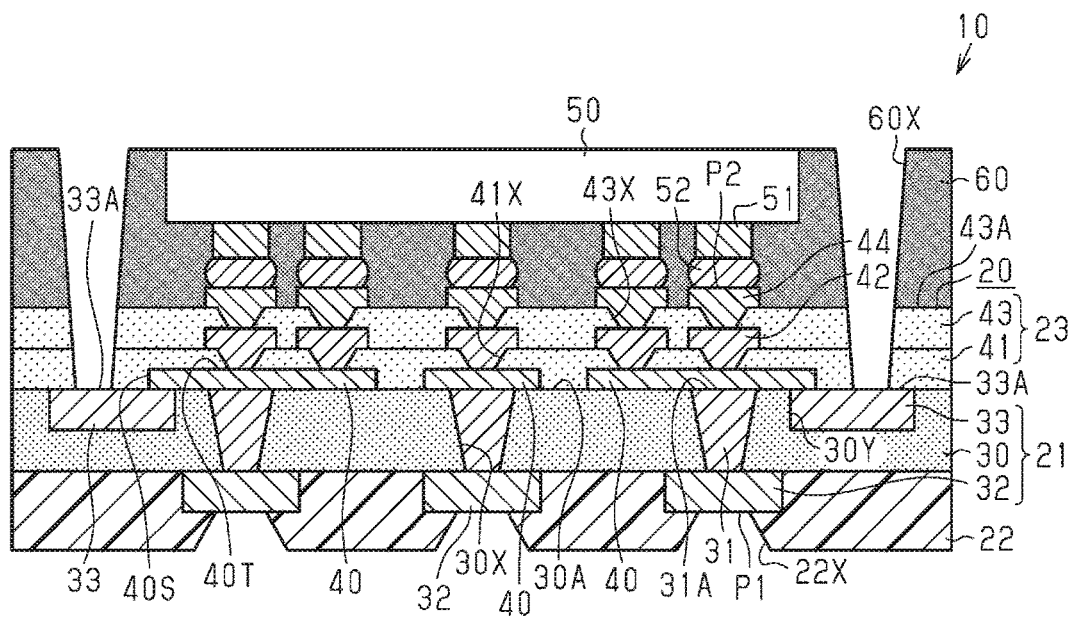
FIG. 1 is a schematic sectional view showing a semiconductor package according to a first embodiment.

For example, a semiconductor package 10 shown in FIG. 1 is a lower-side semiconductor package in a semiconductor device having a POP (Packet On Package) structure. The semiconductor package 10 has a wiring board 20, a semiconductor chip 50, a sealing resin 60, and through holes 60X. The semiconductor chip 50 is mounted on the wiring board 20. The sealing resin 60 covers a portion of the semiconductor chip 50. The through holes 60X penetrate the sealing resin 60 and some insulating layers of the wiring board 20.

The wiring board 20 has a wiring structure 21, a solder resist layer 22, and a wiring structure 23. The solder resist layer 22 is formed on a lower side of the wiring structure 21. The wiring structure 23 is formed on an upper side of the wiring structure 21. First, the structure of the wiring structure 21 will be described.

The wiring structure 21 is a low-density wiring structure in which wiring layers lower in wiring density than those in the wiring structure 23 are formed. The wiring structure 21 has an insulating layer 30, via wirings 31, a wiring layer 32, and a wiring layer 33. The via wirings 31 penetrate the insulating layer 30 in a thickness direction. The wiring layer 32 is formed on a lower surface of the insulating layer 30. The wiring layer 33 is embedded in an upper surface 30A side of the insulating layer 30.

For example, an insulating resin higher in mechanical strength (rigidity, hardness, etc.) than a photosensitive resin can be used as the material of the insulating layer 30. For example, a non-photosensitive insulating resin containing a thermosetting resin as a main component can be used as the material of the insulating layer 30. For example, a so-called glass epoxy resin can be used as the material of the insulating layer 30. The glass epoxy resin is formed by impregnating a glass cloth (glass woven fabric) as a reinforcing material with a thermosetting insulating resin containing an epoxy resin as a main component, and then hardening the thermosetting insulating resin. The reinforcing material is not limited to the glass cloth. For example, glass non-woven fabric, aramid woven fabric, aramid non-woven fabric, LCP (Liquid Crystal Polymer) woven fabric, or LCP non-woven fabric can be used. The thermosetting insulating resin is not limited to the epoxy resin. For example, an insulating resin such as a polyimide resin or a cyanate resin can be used. For example, a non-photosensitive insulating resin which contains a reinforcing material-free thermosetting resin as a main component may be used as the material of the insulating layer 30. For example, the insulating layer 30 may contain a filler such as silica or alumina. For example, an insulating resin which is adjusted to make the coefficient of thermal expansion (CTE) of the insulating layer 30 equal to the coefficient of thermal expansion of each of the solder resist layer 22 and the sealing resin 60 is preferably used as the material of the insulating layer 30. For example, it is preferable that the coefficient of thermal expansion of the insulating layer 30 is adjusted to be equal to or lower than 20 ppm/° C. Incidentally, for example, the content of the filler etc. can be changed to adjust such a coefficient of thermal expansion. In addition, the thickness of the insulating layer 30 can be set, for example, in a range of about 30 to 50 μm.

Through holes 30X which are provided as openings at certain places in the upper surface 30A to penetrate the insulating layer 30 in the thickness direction to thereby expose portions of an upper surface of the wiring layer 32 are formed in the insulating layer 30. Each of the through holes 30X is formed into a tapered shape whose diameter is gradually smaller from an upper side (wiring structure 23 side) toward a lower side (wiring layer 32 side) in FIG. 1. For example, the through hole 30X is formed substantially into an inverted truncated conical shape in which an opening diameter of a lower-side opening end is smaller than an opening diameter of an upper-side opening end. For example, the opening diameter of the upper-side opening end of the through hole 30X can be set in a range of about 50 to 100 μm.

The upper surface 30A of the insulating layer 30 is a smooth surface (low roughness surface) with small unevenness. For example, the upper surface 30A of the insulating layer 30 is a polished surface. For example, the upper surface 30A of the insulating layer 30 is smaller in surface roughness than an inner side surface of the through hole 30X. Roughness of the upper surface 30A of the insulating layer 30 is set, for example, to be about 15 to 40 nm in terms of surface roughness Ra value. Roughness of the inner side surface of the through hole 30X is set, for example, to be about 300 to 400 nm in terms of surface roughness Ra value. Here, the surface roughness Ra value is called arithmetic average roughness, which is a kind of numerical value expressing surface roughness. Specifically, the surface roughness Ra value is calculated as follows. That is, heights varying within a measurement region are measured from a surface corresponding to an average line, and absolute values of the measured heights are arithmetically averaged.

The via wirings 31 connected to the wiring layer 32 are formed inside the through holes 30X. The via wirings 31 are formed to penetrate the insulating layer 30 in the thickness direction. The via wirings 31 in this example are filled in the through holes 30X. Therefore, similarly to each of the through holes 30X, each of the via wirings 31 is formed substantially into an inverted truncated conical shape in which an upper end surface 31A is larger than a lower end surface.

The upper end surface 31A of the via wiring 31 is exposed from the upper surface 30A of the insulating layer 30. For example, the upper end surface 31A of the via wiring 31 is formed to be substantially flush with the upper surface 30A of the insulating layer 30. The upper end surface 31A of the via wiring 31 is a smooth surface (low roughness surface) with small unevenness, similarly to the upper surface 30A of the insulating layer 30. For example, the upper end surface 31A of the via wiring 31 is a polished surface. Roughness of the upper end surface 31A of the via wiring 31 is set, for example, to be about 15 to 40 nm in terms of surface roughness Ra value. Incidentally, for example, copper or a copper alloy can be used as the material of the via wiring 31.

A plurality of recess portions 30Y are formed at certain places (outer side regions than a region where the through holes 30X are formed in this case) in the upper surface 30A of the insulating layer 30 so that the recess portions 30Y can be recessed on the lower surface side of the insulating layer 30. Each of the recess portions 30Y is formed to extend from the upper surface 30A of the insulating layer 30 up to a midway position of the insulating layer 30 in the thickness direction. That is, the recess portion 30Y is formed so that a bottom surface of the recess portion 30Y is located at the midway position of the insulating layer 30 in the thickness direction. The depth of the recess portion 30Y can be set, for example, in a range of about 10 to 15 μm.

The wiring layer 33 is formed inside the recess portions 30Y. The wiring layer 33 constitutes POP connection pads. The wiring layer 33 is embedded in the insulating layer 30. That is, the wiring layer 33 is formed on the bottom surfaces of the recess portions 30Y so that an entire side surface of the wiring layer 33 is covered with the insulating layer 30 constituting side walls of the recess portions 30Y. In other words, the insulating layer 30 is formed to make contact with an entire lower surface and the entire side surface of the wiring layer 33 to thereby cover the entire lower surface and the entire side surface of the wiring layer 33. Incidentally, the thickness of the wiring layer 33 can be set, for example, in a range of about 10 to 15 μm. The line-and-space (L/S) of the wiring layer 33 can be set, for example, at about 20 μm/20 μm. Here, the line-and-space (L/S) means the width of each wiring, and an interval between adjacent wirings.

An upper surface 33A of the wiring layer 33 is exposed from the upper surface 30A of the insulating layer 30. For example, the upper surface 33A of the wiring layer 33 is formed to be substantially flush with the upper surface 30A of the insulating layer 30. The upper surface 33A of the wiring layer 33 is a smooth surface (low roughness surface) with small unevenness, similarly to the upper surface 30A of the insulating layer 30. For example, the upper surface 33A of the wiring layer 33 is a polished surface. Roughness of the upper surface 33A of the wiring layer 33 is set, for example, to be about 15 to 40 nm in terms of surface roughness Ra value. Incidentally, for example, copper or a copper alloy can be used as the material of the wiring layer 33.

The wiring layer 32 is formed on the lower surface of the insulating layer 30 so as to be connected to the lower end surfaces of the via wirings 31. That is, portions of the upper surface of the wiring layer 32 make contact with the lower end surfaces of the via wirings 31 so that the wiring layer 32 and the via wirings 31 are electrically connected to each other. In other words, although the wiring layer 32 and the via wirings 31 are electrically connected to each other, they are formed not integrally but separately. The thickness of the wiring layer 32 can be set, for example, in a range of about 15 to 35 μm. The line-and-space (L/S) of the wiring layer 32 can be set, for example, at about 20 μm/20 μm. Incidentally, for example, copper or a copper alloy can be used as the material of the wiring layer 32.

The solder resist layer 22 is formed on the lower surface of the insulating layer 30 formed as the lowermost layer of the aforementioned wiring structure 21 to thereby cover the lowermost wiring layer 32 of the wiring structure 21. The solder resist layer 22 is an outermost (lowermost in this case) insulating layer in the wiring board 20. For example, a photosensitive insulating resin which contains a phenol-based resin, a polyimide-based resin etc. as a main component can be used as the material of the solder resist layer 22. For example, the solder resist layer 22 may contain a filler such as silica or alumina. For example, an insulating resin which is adjusted to make the coefficient of thermal expansion of the solder resist layer 22 equal to the coefficient of thermal expansion of each of the insulating layer 30 and the sealing resin 60 is preferably used as the material of the solder resist layer 22. For example, it is preferable that the coefficient of thermal expansion of the solder resist layer 22 is adjusted to be equal to or lower than 20 ppm/° C. Moreover, the thickness of the solder resist layer 22 can be set, for example, in a range of about 30 to 50 μm.

Opening portions 22X for exposing portions of the lowermost wiring layer 32 as external connection pads P1 are formed in the solder resist layer 22. External connection terminals 96 (see FIG. 16) which can be used when the wiring board 20 is mounted on a mount board such as a motherboard can be connected to the external connection pads P1. A surface treatment layer may be formed on the wiring layer 32 exposed from the opening portions 22X. A gold (Au) layer, a nickel (Ni) layer/Au layer (a metal layer in which an Ni layer and an Au layer have been formed in the named order), an Ni layer/palladium (Pd) layer/Au layer (a metal layer in which an Ni layer, a Pd layer and an Au layer have been formed in the named order), etc, can be enumerated as examples of the surface treatment layer. Here, the Au layer is a metal layer made of Au or an Au alloy. The Ni layer is a metal layer made of Ni or an Ni alloy. The Pd layer is a metal layer made of Pd or a Pd alloy. For example, a metal layer (electroless plating metal layer) formed by electroless plating can be used as each of the Ni layer, the Au layer and the Pd layer. In addition, antioxidant treatment such as OSP (Organic Solderability Preservative) treatment may be applied to front surfaces of the external connection pads P1 to form a surface treatment layer thereon. For example, when the OSP treatment is applied, a surface treatment layer constituted by an organic coating of an azole compound, an imidazole compound, etc. is formed on the front surfaces of the external connection pads P1. Incidentally, the wiring layer 32 per se exposed from the opening portions 22X (or the surface treatment layer when the surface treatment layer is formed on the wiring layer 32) may be used as external connection terminals.

Each opening portion 22X and each external connection pad P1 can be firmed into any planar shapes and with any sizes. For example, the planar shape of the opening portion 22X and the planar shape of the external connection pad P1 can be formed as circular shapes each having a diameter in a range of about 100 to 150 μm. Moreover, a pitch between adjacent ones of the external connection pads P1 can be set, for example, in a range of about 200 to 300 μm.

Next, the structure of the wiring structure 23 will be described. The wiring structure 23 is a wiring structure disposed on the upper surface 30A of the insulating layer 30 formed as the outermost layer of the wiring structure 21. The wiring structure 23 is a high-density wiring structure in which wiring layers higher in wiring density than those in the wiring structure 21 are formed.

The wiring structure 23 has a structure in which a wiring layer 40 formed on the upper surface 30A of the insulating layer 30, an insulating layer 41, a wiring layer 42, an insulating layer 43, and a wiring layer 44 are formed in the named order. Here, for example, an insulating resin which contains a photosensitive resin such as a phenol-based resin or a polyimide-based resin as a main component can be used as the material of each of the insulating layers 41 and 43. For example, the insulating layer 41, 43 may contain a filler such as silica or alumina. For example, copper or a copper alloy can be used as the material of each of the wiring layers 40, 42 and 44.

Each of the wiring layers 40, 42 and 44 is a wiring layer thinner than each of the wiring layers 32 and 33 of the wiring structure 21. The thickness of the wiring layer 40, 42 formed on the insulating layer 30, 41 can be set, for example, in a range of about 1 to 5 μm. The thickness of the wiring layer 44 formed on the insulating layer 43 can be set, for example, in a range of about 5 to 10 μm. The width of each wiring and an interval between adjacent wirings in the wiring layer 40, 42, 44 are smaller than the width of each wiring and an interval between adjacent wirings in the wiring layer 32, 33 inside the wiring structure 21. The line-and-space (L/S) of the wiring layer 40, 42, 44 can be set, for example, at about 2 μm/2 μm to 3 μm/3 μm. In addition, each of the insulating layers 41 and 43 is an insulating layer thinner than the insulating layer 30 inside the wiring structure 21. The thickness of the insulating layer 41, 43 can be set, for example, in a range of about 3 to 10 μm.

The wiring layer 40 is formed on the upper surface 30A of the insulating layer 30 to be connected to the upper end surfaces 31A of the via wirings 31. That is, portions of a lower surface of the wiring layer 40 make contact with the upper end surfaces 31A of the via wirings 31 so that the wiring layer 40 and the via wirings 31 are electrically connected to each other. In other words, the wiring layer 40 and the via wirings 31 are connected to each other but they are formed not integrally but separately.

Portions of the wiring layer 40 are formed on the upper surface 30A of the insulating layer 30 so as to be connected to portions of the upper surface 33A of the wiring layer 33. The portions of the lower surface of the wiring layer 40 make contact with the upper surface 33A of the wiring layer 33 so that the wiring layer 40 and the wiring layer 33 are electrically connected to each other. In this manner, the wiring layer 40 and the wiring layer 33 are connected to each other directly without the interposition of the via wirings etc. therebetween. Although the wiring layer 40 and the wiring layer 33 are electrically connected to each other, they are formed not integrally but separately.

Next, an example of the connection relation between the wiring layer 40 and the wiring layer 33 will be described in accordance with FIG. 2. Incidentally, the wiring layer 40 shown in FIG. 2 shows only a structure of a connection portion of the wiring layer 40 to the wiring layer 33 and its periphery.

Figure 2:
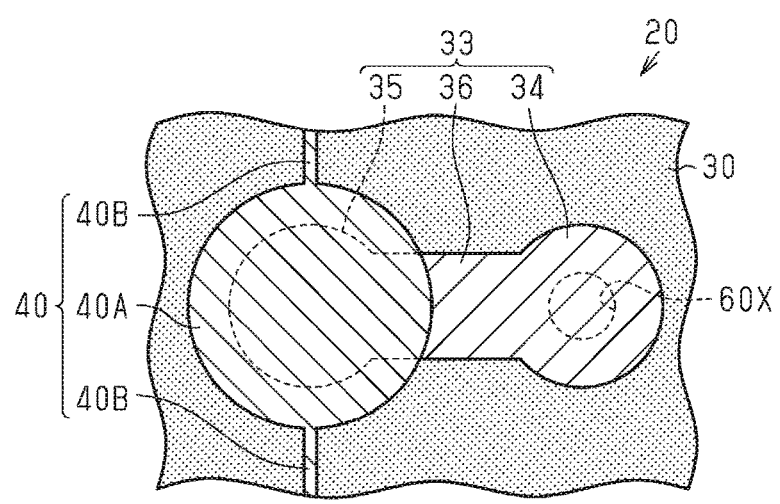
FIG. 2 is a schematic plan view showing a portion of the semiconductor package according to the first embodiment.

As shown in FIG. 2, the wiring layer 33 has a pad 34, a pad 35 which are connected to the wiring layer 40, and a circuit pattern 36 which connects the pad 34 and the pad 35 to each other. The pad 34, the pad 35 and the circuit pattern 36 are formed integrally.

For example, the pad 34 is provided in an outer peripheral region of the wiring board 20. The pad 34 is a POP connection pad. For example, a connection terminal for making connection with an electronic component such as another wiring board (semiconductor package) or a semiconductor chip is connected substantially to the center of an upper surface of the pad 34 in a plan view. For example, the pad 34 is formed substantially into a circular shape in a plan view.

For example, the pad 35 is provided in an inner region than the outer peripheral region where the pad 34 is formed. For example, the pad 35 is formed substantially into a circular shape in a plan view. For example, the circuit pattern 36 is formed substantially into a rectangular shape in a plan view. The circuit pattern 36 is formed to be routed in a planar direction (direction perpendicular to the thickness direction of the insulating layer 30 in a sectional view). For example, the circuit pattern 36 is formed to extend out toward the pad 35 from the pad 34 in the planar direction. In the wiring layer 33 in this example, the pad 34 is formed at one end portion of the circuit pattern 36 and the pad 35 is formed at the other end portion of the circuit pattern 36.

The wiring layer 40 has a pad 40A and a circuit pattern 40B. The pad 40A and the circuit pattern 40B are formed integrally. The pad 40A is formed to overlap with the pad 35 of the wiring layer 33 in a plan view. In addition, the pad 40A in this example is formed to overlap with a portion of the circuit pattern 36 of the wiring layer 33 in a plan view. A lower surface of the pad 40A is directly connected to an upper surface of the pad 35 and a portion of an upper surface of the circuit pattern 36. Thus, the pad 40A (wiring layer 40) is electrically connected to the pad 35 and the circuit pattern 36 (wiring layer 33). Incidentally, the pad 40A in this example is formed substantially into a circular shape in a plan view.

For example, the circuit pattern 40B is formed to extend out from the pad 40A in the planar direction. For example, the circuit pattern 40B is formed substantially into a rectangular shape in a plan view. The width of the circuit pattern 40b is formed to be narrower than the width of the circuit pattern 36.

In the embodiment, as shown in FIG. 1, a step is formed along an upper surface 40T and a side surface 40S of the wiring layer 40 and the upper surface 334 of the wiring layer 33 in each connection portion between the wiring layer 33 and the wiring layer 40.

The insulating layer 41 is formed on the upper surface 30A of the insulating layer 30 to thereby cover the wiring layer 40. The insulating layer 41 is formed to cover portions of the upper surface 40T of the wiring layer 40 and the entire side surface 40S of the wiring layer 40. In addition, the insulating layer 41 is formed to cover the upper surface 33A of the wiring layer 33 exposed from the wiring layer 40. Thus, the insulating layer 41 is formed to cover the step formed along the upper surface 40T and the side surface 40S of the wiring layer 40 and the upper surface 33A of the wiring layer 33.

Through holes 41X which penetrate the insulating layer 41 in the thickness direction to expose portions of the upper surface 40T of the wiring layer 40 are formed at certain places in the insulating layer 41.

The wiring layer 42 is formed on an upper surface of the insulating layer 41. The wiring layer 42 is electrically connected to the wiring layer 40. The wiring layer 42 has via wirings filled in the through holes 41X, and wiring patterns formed on the upper surface of the insulating layer 41.

The insulating layer 43 is formed on the upper surface of the insulating layer 41 to cover the wiring layer 42. Through holes 43X which penetrate the insulating layer 43 in the thickness direction to expose portions of an upper surface of the wiring layer 42 are formed at certain places in the insulating layer 43.

Here, each of the through holes 41X and 43X is formed into a tapered shape whose diameter is gradually smaller from the upper side (wiring layer 44 side) toward the lower side (wiring structure 21 side) in FIG. 1. For example, the through hole 41X, 43X is formed substantially into an inverted truncated conical shape in which ate opening diameter of an upper-side opening end is larger than an opening diameter of a lower-side opening end. The opening diameter of the upper-side opening end of the through hole 41X, 43X can be set, for example, in a range of about 5 to 10 μm.

The wiring layer 44 is formed on an upper surface 43A of the insulating layer 43. The wiring layer 44 has via wirings which are filled in the through holes 43X, and connection terminals P2 which protrude upward from the upper surface 43A of the insulating layer 43. For example, each of the connection terminals P2 is a columnar connection terminal (metal post) which is formed to extend upward from the upper surface 43A of the insulating layer 43. The connection terminal P2 can be formed into any planar shape and with any size. For example, the planar shape of the connection terminal P2 can be formed as a circular shape having a diameter in a range of about 20 to 25 μm. A pitch between adjacent ones of the connection terminals P2 can be set, for example, in a range of about 40 to 50 μm. The connection terminals P2 serve as electronic component mounting pads for making electric connection with an electronic component such as a semiconductor chip.

A surface treatment layer may be formed on front surfaces (upper surfaces and side surfaces or only upper surfaces) of the connection terminals P2. As the surface treatment layer, for example, a surface treatment layer the same as that formed on the external connection pads P1 can be used.

A semiconductor chip 50 is flip-chip mounted on the aforementioned wiring board 20. That is, when connection terminals 51 disposed on a circuit formation surface (lower surface in this case) of the semiconductor chip 50 are bonded to the connection terminals P2 of the wiring board 20 through a bonding member 52, the semiconductor chip 50 is connected to the wiring layer 44 through the connection terminals 51 and the bonding member 52.

For example, a logic chip such as a CPU (Central Processing Unit) chip or a GPU (Graphics Processing Unit) chip can be used as the semiconductor chip 50. Moreover, for example, a memory chip such as a DRAM (Dynamic Random Access Memory) chip, an SRAM (Static Random Access Memory) chip or a flash memory chip may be used as the semiconductor chip 50. Incidentally, when a plurality of semiconductor chips 50 are mounted on the wiring board 20, the logic chip and the memory chip may be used in combination to be mounted on the wiring board 20. Incidentally, the thickness of each semiconductor chip 50 can be set, for example, in a range of about 200 to 300 μm.

For example, a metal post can be used as each of the connection terminals 51. The connection terminal 51 is a columnar connection terminal extending downward from the circuit formation surface of the semiconductor chip 50. For example, the connection terminal 51 in this example is formed into a cylindrical shape. For example, copper or a copper alloy can be used as the material of the connection terminal 51. In addition to the metal post, for example, a gold bump may be used as the connection terminal 51.

The bonding member 52 is bonded to the connection terminals 51, and bonded to the wiring layer 44. For example, a tin (Sn) layer or solder plating of a lead (Pb)-free solder can be used as the bonding member 52. For example, an Sn-silver (Ag)-based, Sn—Cu-based, or Sn—Ag—Cu-based lead-free solder can be used as the material of the solder plating.

The sealing resin 60 is formed on the upper surface 43A of the uppermost insulating layer 43 of the wiring board 20 so as to seal the semiconductor chip 50. The sealing resin 60 is formed so as to cover the circuit formation surface (lower surface in this case) and a side surface of the semiconductor chip 50 and cover the upper surface 43A of the insulating layer 43, the connection terminals P2, the connection terminals 51, and the bonding member 52. The sealing resin 60 in this example is formed to expose a back surface (upper surface in this case) of the semiconductor chip 50 on an opposite side to the circuit formation surface. For example, an upper surface of the sealing resin 60 is formed to be substantially flush with the back surface of the semiconductor chip 50.

For example, an insulating resin higher in mechanical strength (rigidity, hardness, etc.) than a photosensitive resin can be used as the material of the sealing resin 60. For example, a non-photosensitive insulating resin containing a thermosetting resin as a main component can be used as the material of the sealing resin 60. An insulating resin such as an epoxy resin or a polyimide resin, or any of resin materials in which a filler such as silica or alumina is mixed into these resins can be used as the material of the sealing resin 60. For example, a molding resin can be used as the sealing resin 60. For example, an insulating resin which is adjusted to make the coefficient of thermal expansion of the sealing resin 60 equal to the coefficient of thermal expansion of each of the insulating layer 30 and the solder resist layer 22 is preferably used as the material of the sealing resin 60. For example, the coefficient of thermal expansion of the sealing resin 60 is preferably adjusted to be equal to or lower than 20 ppm/° C. Moreover, the thickness of the sealing resin 60 can be set, for example, in a range of about 300 to 400 μm.

The through holes 60X which penetrate the sealing resin 60 and both the insulating layers 41 and 43 of the wiring structure 23 in the thickness direction to thereby expose portions of the upper surface 33A of the wiring layer 33 are formed in the semiconductor package 10. For example, the through holes 60X are formed to expose portions of the upper surfaces of the pads 34 of the wiring layer 33 shown in FIG. 2. Each of the through holes 60X is formed into a tapered shape whose diameter is gradually smaller from the upper side (upper surface side of the sealing resin 60) toward the lower side (wiring layer 33 side) in FIG. 1. For example, the through hole 60X is formed substantially into an inverted truncated conical shape in which an opening diameter of a lower-side opening end is smaller than an opening diameter of apt upper-side opening end. For example, the opening diameter of the upper-side opening end of the through hole 60X can be set in a range of about 300 to 500 μm. Incidentally, the shape of the through hole 60X is not limited thereto. For example, the through hole 60X may be formed into a shape in which the opening diameter of the lower-side opening end is equal to the opening diameter of the upper-side opening end.

The wiring layer 33 (pads 34) exposed in bottom portions of the through holes 60X serves as POP connection pads. The wiring layer 33 (pads 34) serving as the POP connection pads is embedded in the insulating layer 30 made of the thermosetting resin. Therefore, when another semiconductor package is stacked and bonded on the semiconductor package 10, a force applied to the wiring layer 33 can be received by the insulating layer 30 made of the thermosetting resin high in mechanical strength. Thus, resin fracture such as cracking can be suppressed from occurring in the insulating layer 30 due to the external force applied to the wiring layer 33. Incidentally, if occasions demand, a surface treatment layer may be formed on the front surface of the wiring layer 33 (pads 34) exposed from the through holes 60X. As the surface treatment layer, for example, a surface treatment layer the same as that formed on the external connection pads P1 can be used.

Next, a method for manufacturing the semiconductor package 10 will be described. Although one semiconductor package 10 will be enlarged and described in the following description, a member including a plurality of semiconductor packages 10 is practically manufactured collectively on one substrate and then divided into the semiconductor packages 10 individually and separately.

Figure 3A:
FIGS. 3A to 3D are schematic sectional views showing a method for manufacturing the semiconductor package according to the first embodiment.

As shown in FIG. 3A, a support substrate 100 is prepared. For example, a metal plate or a metal foil can be used as the support substrate 100. A copper foil in which an extremely thin copper foil is stuck on a support copper foil through a release layer is used as the support substrate 100 in this example. The extremely thin copper foil is about 2 μm to 5 μm thick. The support copper foil is about 35 to 70 μm thick.

Next, a metal film 101 is formed on an upper surface of the support substrate 100 to cover the entire upper surface of the support substrate 100. For example, the metal film 101 is formed on an upper surface of the extremely thin copper foil of the support substrate 100. For example, the metal film 101 can be formed by sputtering, electrolytic plating or evaporation. An electrically conductive material which can serve as a stopper layer when the support substrate 100 is removed by etching can be used as the material of the metal film 101. In addition, an electrically conductive material which can be selectively removed by etching with respect to the wiring layer 33 which will be formed in a subsequent step can be used as the material of the metal film 101. For example, a metal such as titanium (Ti), Ni, chromium (Cr) or Sn, or an alloy containing at least one selected from the aforementioned metals can be used as the material of such a metal film 101. Ni is used as the material of the metal film 101 in this example. The thickness of the metal film 101 can be set, for example, in a range of about 10 to 50 nm.

Successively, a seed layer 102 is formed on an upper surface of the metal film 101 to cover the entire upper surface of the metal film 101. For example, the seed layer 102 can be formed by sputtering, electrolytic plating or electroless plating. For example, copper or a copper alloy can be used as the material of the seed layer 102. The thickness of the seed layer 102 can be set, for example, in a range of about 100 to 500 nm.

Figure 3B:
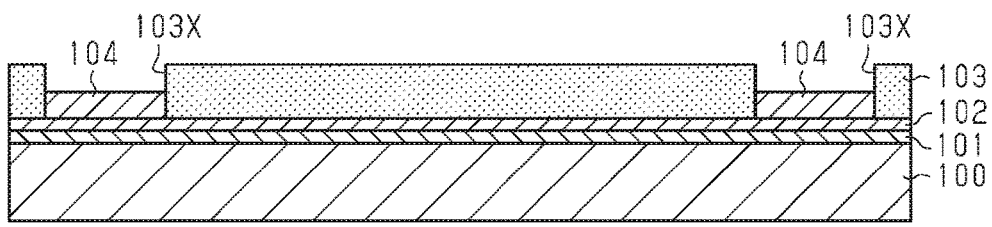

Next, in a step shown in FIG. 3B, a resist layer 103 having opening patterns 103X is formed on an upper surface of the seed layer 102. The opening patterns 103X are formed to expose the upper surface of the seed layer 102 in portions corresponding to regions where the wiring layer 33 should be formed (see FIG. 1). As the material of the resist layer 103, for example, a material which is plating-resistant to plating treatment in a next step can be used. For example, a photosensitive dry film resist or a liquid photoresist (e.g. a dry film resist or a liquid photoresist of a novolac-based resin or an acrylic-based resin etc.) etc. can be used as the material of the resist layer 103. For example, assume that the photosensitive dry film resist is used. In this case, a dry film is laminated on the upper surface of the seed layer 102 by thermocompression bonding, and the dry film is then patterned by photolithographing. In this manner, the resist layer 103 having the opening patterns 103X is formed, incidentally, in the case where the liquid photoresist is used alternatively, the resist layer 103 can be also formed by a similar step.

Successively, when electrolytic plating (electrolytic copper plating in this case) using the seed layer 102 as a plating power feeding layer is performed with the resist layer 103 as a plating mask, a metal layer 104 is formed on the upper surface of the seed layer 102 exposed from the opening patterns 103X of the resist layer 103.

Figure 3C:
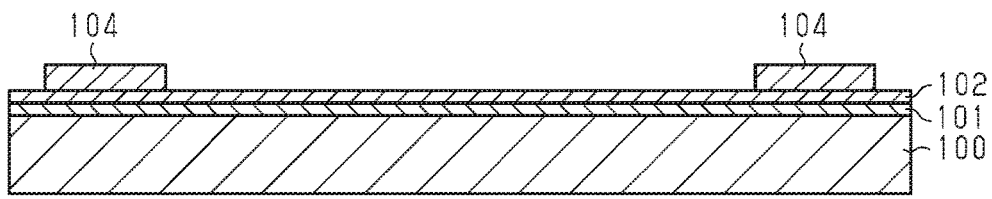

Successively, in a step shown in FIG. 3C, the resist layer 103 shown in FIG. 3B is removed by a release agent (e.g. an organic amine-based release agent, caustic soda, acetone, ethanol. etc.).

Figure 3D:
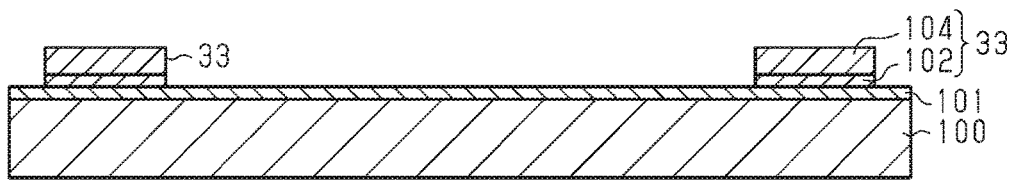

Next, in a step shown in FIG. 3D, an unnecessary portion of the seed layer 102 is removed by etching (e.g. wet etching) with the metal layer 104 as an etching mask. For example, an acid aqueous solution such as a sulfuric acid/hydrogen peroxide mixture solution (a mixed aqueous solution of sulfuric acid and hydrogen peroxide water) can be used as an etchant of the wet etching. By this step, a wiring layer 33 constituted by the seed layer 102 and the metal layer 104 is formed on the upper surface of the metal film 101.

Figure 4A:
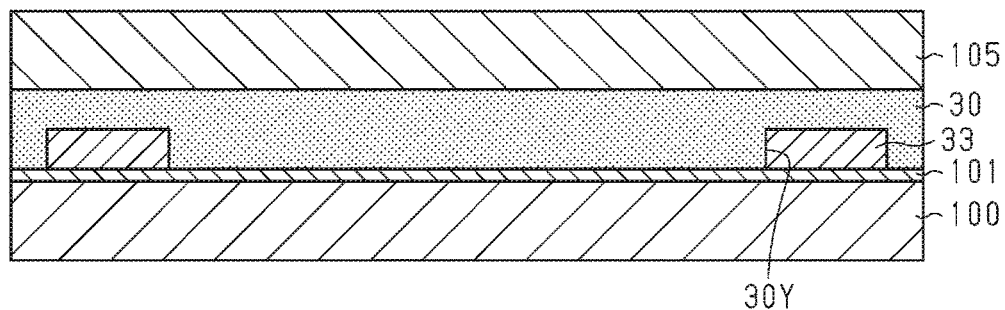
FIGS. 4A to 4D are schematic sectional views showing the method for manufacturing the semiconductor package according to the first embodiment.

Next, in a step shown in FIG. 4A, an insulating layer 30 is formed on the upper surface of the metal film 101 to cover an entire upper surface and an entire side surface of the wiring layer 33. For example, assume that a film-like insulating resin is used as the material of the insulating layer 30. In this case, the film-like insulating resin is formed on the upper surface of the metal film 101. In this step, the film-like insulating resin is not thermally hardened, but formed in a semi-hardened state in advance. Assume that a liquid or paste-like insulating resin is used as the material of the insulating layer 30 alternatively. In this case, the liquid or paste-like insulating resin is applied on the upper surface of the metal film 101 by printing, spin coating, etc. Then, the liquid or paste-like insulating resin applied thus is prebaked so as to be changed into a semi-hardened state.

Successively, a support substrate 105 is formed on the semi-hardened insulating layer 30. For example, a metal plate or a metal foil can be used as the support substrate 105. A copper foil in which an extremely thin copper foil is attached on a support copper foil through a release layer is used as the support substrate 105 in this example. The extremely thin copper foil is about 2 to 5 μin thick. The support copper foil is about 35 to 70 μm thick. For example, the support substrate 105 (copper foil) is laminated on the half-hardened insulating layer 30 by thermocompression bonding. For example, the support substrate 105 is laminated on the semi-hardened insulating layer 30 so that the extremely thin copper foil of the support substrate 105 can make contact with the insulating layer 30. Then, the semi-hardened insulating layer 30 is cured (subjected to thermosetting treatment) and hardened in an atmosphere with a temperature of about 170° C. On this occasion, the insulating layer 30 is adhesively bonded to the support substrate 105 and the metal film 101 due to the hardening of the insulating layer 30. In addition, by this step, recess portions 30Y for receiving the wiring layer 33 therein are formed in the insulating layer 30 so that the wiring layer 33 can be formed on bottom surfaces of the recess portions 30Y.

Figure 4B:
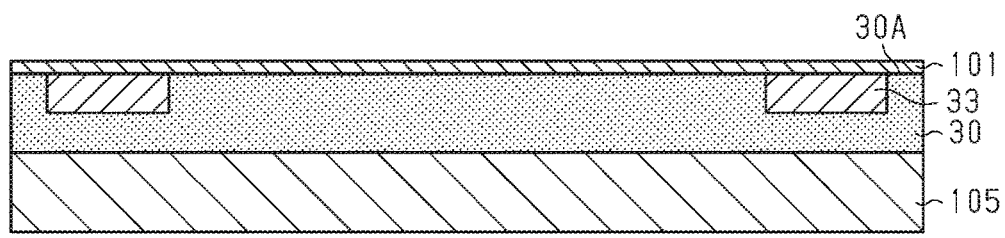

Next, the support substrate 100 is removed. For example, the support copper foil of the support substrate 100 is mechanically released from the extremely thin copper foil of the same. On this occasion, due to the release layer interposed between the support copper foil and the extremely thin copper foil, an adhesive force between the support copper foil and the extremely thin copper foil is so weak that the support copper foil can be released from the extremely thin copper foil easily. Then, the extremely thin copper foil staying behind on the metal film 101 is removed by wet etching using a ferric chloride aqueous solution, a cupric chloride aqueous solution, an ammonium persulfate aqueous solution, etc. On this occasion, the metal film 101 serves as an etching stopper layer when the extremely thin copper foil of the support substrate 100 is etched. By this step, a front surface of the metal film 101 is exposed to the outside, as shown in FIG. 4B. Incidentally, in FIG. 4B, a structure body shown in FIG. 4B is illustrated upside down as compared with that in FIG. 4A.

Figure 4C:
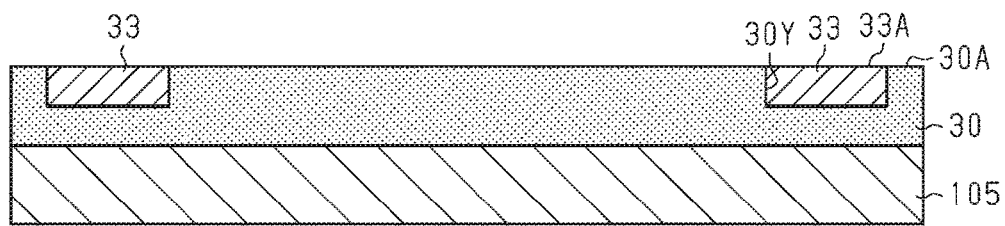

Successively, the metal film 101 is removed. For example, assume that Ti is used as the material of the metal film 101. In this case, the metal film 101 is selectively etched with respect to the wiring layer 33 (Cu layer) by dry etching using etching gas of carbon tetrafluoride ($CF_4$) or by wet etching using a potassium hydroxide (KOH)-based etchant. Thus, the metal film 101 is removed. On this occasion, the wiring layer 33 and the insulating layer 30 serve as etching stopper layers when the metal film 101 is etched. By this step, an upper surface 30A of the insulating layer 30 and an upper surface 33A of the wiring layer 33 are exposed to the outside, as shown in FIG. 4C.

Figure 4D:
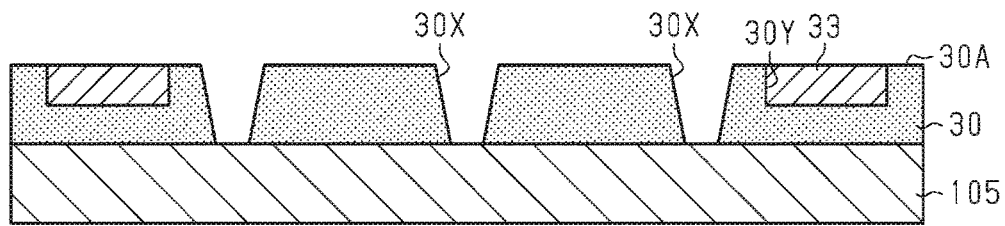

Next, in a step shown in FIG. 4D, through holes 30X are formed at predetermined places in the insulating layer 30 to expose portions of an upper surface of the support substrate 105. For example, the through holes 30X can be formed by laser machining using a $CO_2$ laser, a UV-YAG laser, etc. Next, in the case where the through holes 30X have been formed by laser machining, desmear treatment is performed to remove resin smears adhering to the exposed surface of the support substrate 105 exposed in bottom portions of the through holes 30X. By the desmear treatment, inner side surfaces of the through holes 30X and the upper surface 30A of the insulating layer 30 are roughened.

Figure 5A:
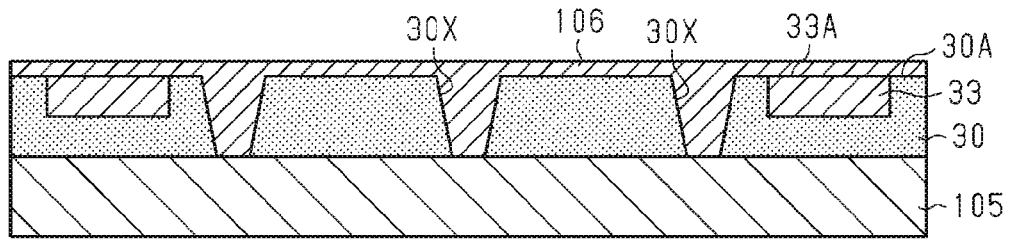
FIGS. 5A to 5D are schematic sectional views showing the method for manufacturing the semiconductor package according to the first embodiment.

Next, in a step shown in FIG. 5A, a seed layer (not shown) is formed to cover the entire front surface of the insulating layer 30 including the innerside surfaces of the through holes 30X, the entire upper surface of the support substrate 105 exposed in the through holes 30X, and the upper surface 33A of the wiring layer 33, and electrolytic plating using the seed layer as a power feeding layer is performed. For example, the seed layer is formed by electroless copper plating, and electrolytic copper plating using the seed layer as a power feeding layer is performed. Thus, an electrically conductive layer 106 is formed to fill the through holes 30X and cover the entire upper surface 30A of the insulating layer 30 and the entire upper surface 33A of the wiring layer 33.

Figure 5B:
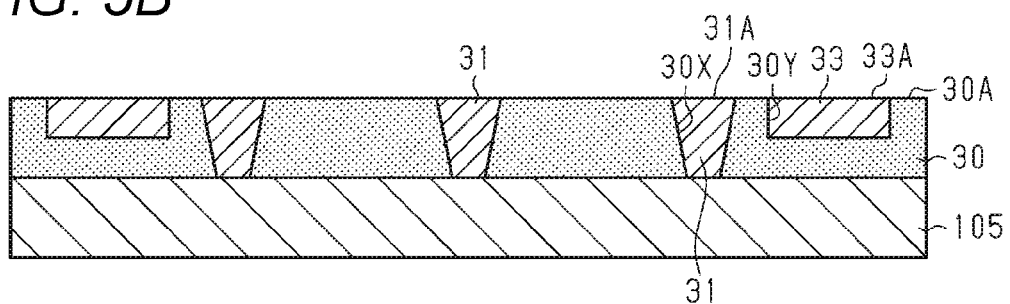

Successively, for example, by CMP (Chemical Mechanical Polishing) etc., the electrically conductive layer 106 protruding from the upper surface 30A of the insulating layer 30 is polished, and a portion of the upper surface 33A of the wiring layer 33 and a portion of the upper surface 30A of the insulating layer 30 which is a roughened surface are polished. Thus, via wirings 31 filled in the through holes 30X are formed, and upper end surfaces 31A of the via wirings 31, the upper surface 30A of the insulating layer 30 and the upper surface 33A of the wiring layer 33 are formed to be substantially flush with one another, as shown in FIG. 5B. In addition, when the portion of the upper surface 30A of the insulating layer 30 is polished, the upper surface 30A of the insulating layer 30 is smoothened. For example, roughness of the upper surface 30A of the insulating layer 30 prior to polishing is about 300 to 400 nm in terms of surface roughness Ra value, whereas the roughness of the upper surface 30A of the insulating layer 30 can be changed to about 15 to 40 nm in terms of surface roughness Ra value due to polishing. In other words, by this step, the upper surface 30A of the insulating layer 30 is polished so that the upper surface 30A of the insulating layer 30 can be smoothened (e.g. to have a surface roughness Ra value of about 15 to 40 nm). Incidentally, since the inner side surfaces of the through holes 30X are kept roughened as they are, surface roughness of the upper surface 30A of the insulating layer 30 is smaller than that of the inner side surface of each through hole 30X. By polishing in this step, the upper surface 30A of the insulating layer 30, the upper end surfaces 31A of the via wirings 31, and the upper surface 33A of the wiring layer 33 are changed to polished surfaces.

Figure 5C:
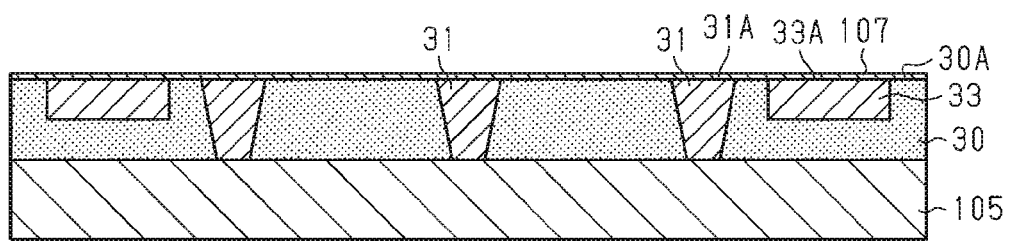

Next, in a step shown in FIG. 5C, a seed layer 107 is formed to cover the entire upper surface 30A of the insulating layer 30, the entire upper end surfaces 31A of the via wirings 31, and the upper surface 33A of the wiring layer 33. For example, the seed layer 107 can be formed by sputtering or electroless plating. For example, since the upper surface 30A of the insulating layer 30 is a smooth surface, the seed layer 107 can be formed uniformly on the upper surface 30A by sputtering in this step so that an upper surface of the seed layer 107 can be formed smoothly. For example, assume that the seed layer 107 is formed by sputtering. In this case, titanium (Ti) is deposited on the upper surface 30A of the insulating layer 30, the upper end surfaces 31A of the via wirings 31, and the upper surface 33A of the wiring layer 33 by sputtering, so that a Ti layer can be formed to cover the upper surfaces 30A and 33A and the upper end surfaces 31A. Then, copper is deposited on the Ti layer by sputtering so that a Cu layer can be formed. Thus, the seed layer 107 having a two-layer structure (the Ti layer/the Cu layer) can be formed. Incidentally, the thickness of the Ti layer can be set, for example, in a range of about 10 to 50 nm, and the thickness of the Cu layer can be set, for example, in a range of about 100 to 500 nm. Since the Ti layer (adhesive layer) is formed as a lower layer of the seed layer 107 in this manner, adhesion between the insulating layer 30 and the seed layer 107 can be improved. Incidentally, the Ti layer may be changed to a titanium nitride (TiN) layer made of TiN so that the seed layer 107 having a two-layer structure consisting of the TiN layer and the Cu layer can be formed. Here, titanium or titanium nitride is a metal which has higher adhesion to the insulating layer 30 than copper and higher corrosion resistance than copper.

On the other hand, in the case where the seed layer 107 is formed by electroless plating alternatively, for example, the seed layer 107 consisting of a Cu layer (one-layer structure) can be formed by electroless copper plating. Next, in a step shown in FIG. 5D, a resist layer 108 having opening patterns 108X at predetermined places is formed on the seed layer 107. The opening patterns 108X are formed to expose the seed layer 107 in portions corresponding to regions where a wiring layer 40 (see FIG. 1) should be formed. Therefore, portions of the opening patterns 108X are formed to overlap with portions of the upper surface 33A of the wiring layer 33 in a plan view. As the material of the resist layer 108, for example, a material which is plating-resistant to plating treatment in a next step can be used. For example, the same material as that of the resist layer 103 (see FIG. 3B) can be used as the material of the resist layer 108. In addition, the resist layer 108 can be formed by the same method as the resist layer 103. In this step, patterning failure can be suppressed from occurring in the resist layer 108 formed on the seed layer 107 because the upper surface of the seed layer 107 is a smooth surface. That is, the opening patterns 108X can be formed in the resist layer 108 with high accuracy.

Next, electrolytic plating using the seed layer 107 as a plating power feeding layer is performed on the upper surface of the seed layer 107 with the resist layer 108 as a plating mask. Specifically, when electrolytic plating (electrolytic copper plating in this case) is performed on the upper surface of the seed layer 107 exposed from the opening patterns 108X of the resist layer 108, a metal layer 109 (electrolytic plating metal layer) is formed on the upper surface of the seed layer 107. Incidentally, the thickness of the metal layer 109 can be set, for example, in a range of about 2 to 5 µm.

Figure 5D:
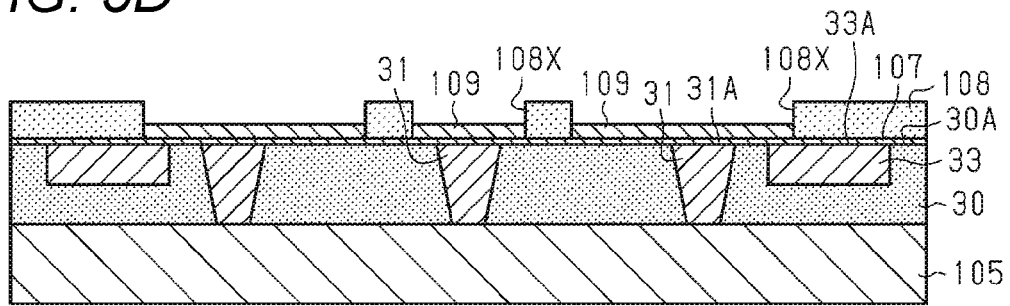
Figure 6A:
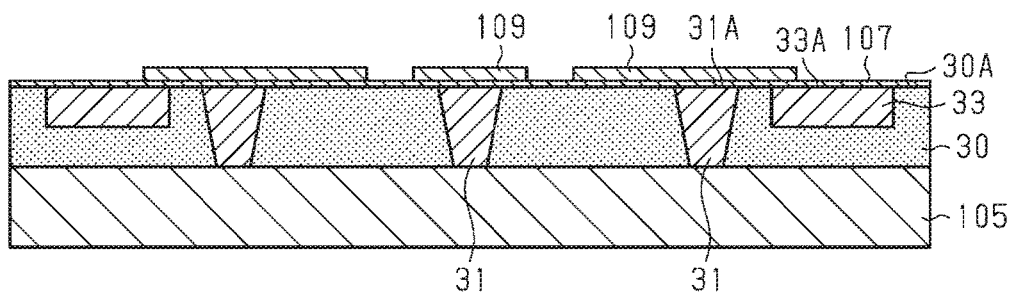
FIGS. 6A to 6D are schematic sectional views showing the method for manufacturing the semiconductor package according to the first embodiment.

Successively, in a step shown in FIG. 6A, the resist layer 108 shown in FIG. 5D is removed, for example, by an alkaline release agent.

Figure 6B:
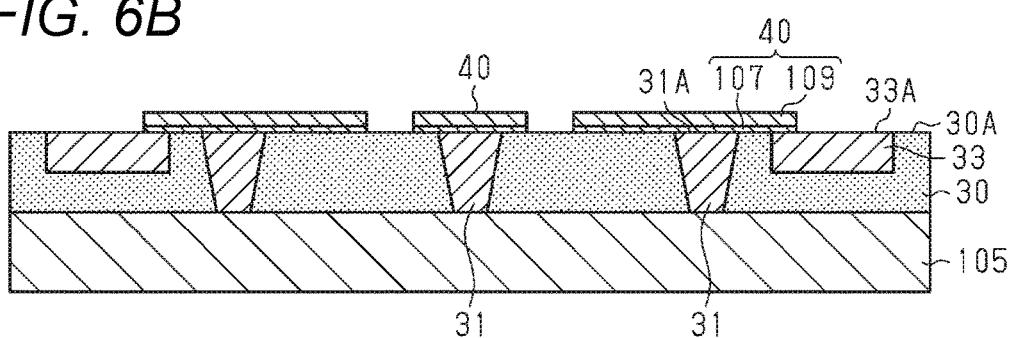

Next, an unnecessary portion of the seed layer 107 is removed by etching with the metal layer 109 as an etching mask. For example, in the case where the seed layer 107 consists of the Ti layer and the Cu layer, the Cu layer is first removed by wet etching using a sulfuric acid/hydrogen peroxide mixture-based etchant. Then, the Ti layer is removed by dry etching using etching gas of $CF_4$ etc. or by wet etching using a KOH-based etchant. By this step, the wiring layer 40 consisting of the seed layer 107 which is brought into contact with the upper end surfaces of the via wirings 31 and portions of the upper surface 33A of the wiring layer 33, and the metal layer 109 which is formed on the seed layer 107 is formed on the upper surface 30A of the insulating layer 30, as shown in FIG. 6B. Thus, the wiring layer 40 is formed by a semi-additive method. In addition, since the wiring layer 40, the via wirings 31 and the wiring layer 33 are formed in separate steps, the wiring layer 40, the via wirings 31 and the wiring layer 33 are not formed integrally. In FIGS. 6C to 9C following FIG. 6B, the seed layer 107 and the metal layer 109 are not shown but illustrated as the wiring layer 40.

Figure 6C:
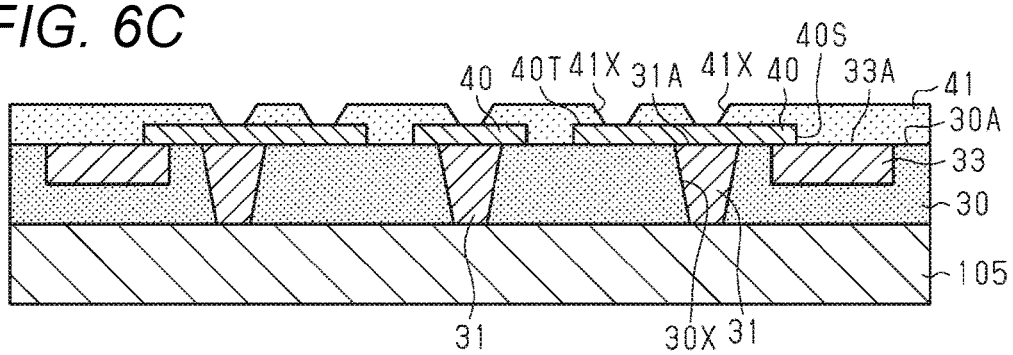

Next, in a step shown in FIG. 6C, an insulating layer 41 having through holes 41X exposing portions of an upper surface 40T of the wiring layer 40 is formed on the upper surface 30A of the insulating layer 30. On this occasion, the insulating layer 41 is formed to cover steps formed along the upper surface 40T and a side surface 40S of the wiring layer 40 and the upper surface 33A of the wiring layer 33.

For example, assume that a resin film is used as the insulating layer 41. In this case, the resin film is laminated on the upper surface 30A of the insulating layer 30 by thermocompression bonding, and the resin film is then patterned by photolithographing so that the insulating layer 41 can be formed. Alternatively, a liquid or paste-like insulating resin may he applied to the upper surface 30A of the insulating layer 30 by spin coating etc., and the insulating resin may be then patterned by photolithographing so that the insulating layer 41 can be formed.

Incidentally, roughness of an upper surface of such an insulating layer 41 made of an insulating resin containing a photosensitive resin as a main component can be set, for example, to be about 2 to 10 nm in terms of surface roughness Ra value. That is, the upper surface of the insulating layer 41 has lower surface roughness than the inner side surface of each through hole 30X and smaller surface roughness than the upper surface 30A (polished surface) of the insulating layer 30.

Figure 6D:
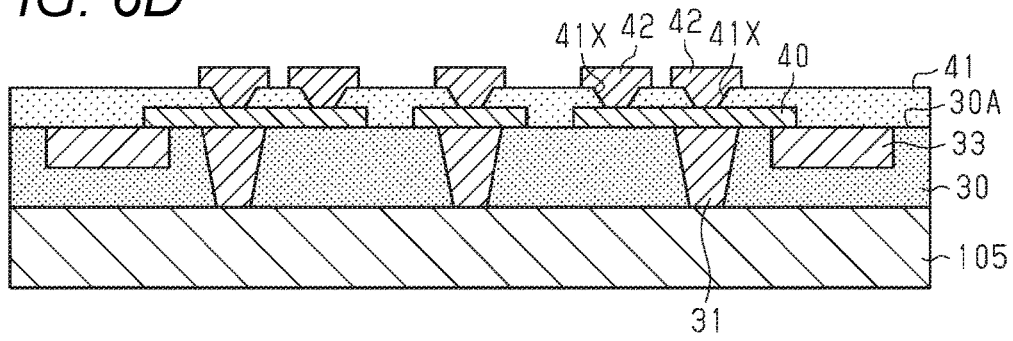

Next, in a step shown in FIG. 6D, a wiring layer 42 having via wirings which are filled in the through holes 41X, and wiring patterns which are electrically connected to the wiring layer 40 through the via wirings and which are stacked on the upper surface of the insulating layer 41 is formed in the same manner as in the steps shown in FIGS. 5C to 6B, e.g. by the semi-additive method.

Figure 7A:
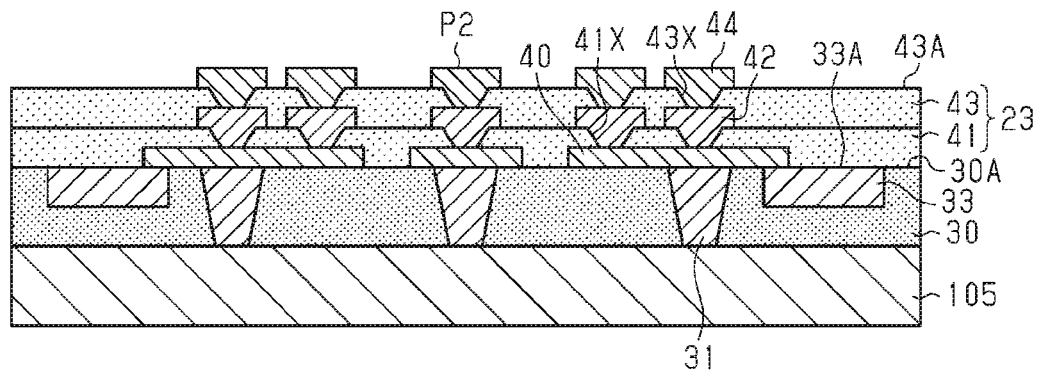
FIGS. 7A to 7C are schematic sectional views showing the method for manufacturing the semiconductor package according to the first embodiment.

Next, in a step shown in FIG. 7A, an insulating layer 43 having through holes 43X exposing portions of an upper surface of the wiring layer 42 is formed on the insulating layer 41 in the same manner as in the step shown in FIG. 6C. Successively, a wiring layer 44 having via wirings which are filled in the through holes 43X, and connection terminals P2 which are electrically connected to the wiring layer 42 through the via wirings and which are stacked on an upper surface 43A of the insulating layer 43 is formed in the same manner as in the steps shown in FIGS. 5C to 6C, e.g. by the semi-additive method. A surface treatment layer may be formed on front surfaces (upper surfaces and side surfaces or only upper surfaces) of the connection terminals P2.

By the aforementioned manufacturing steps, a wiring structure 23 is formed on the upper surface 30A of the insulating layer 30.

Figure 7B:
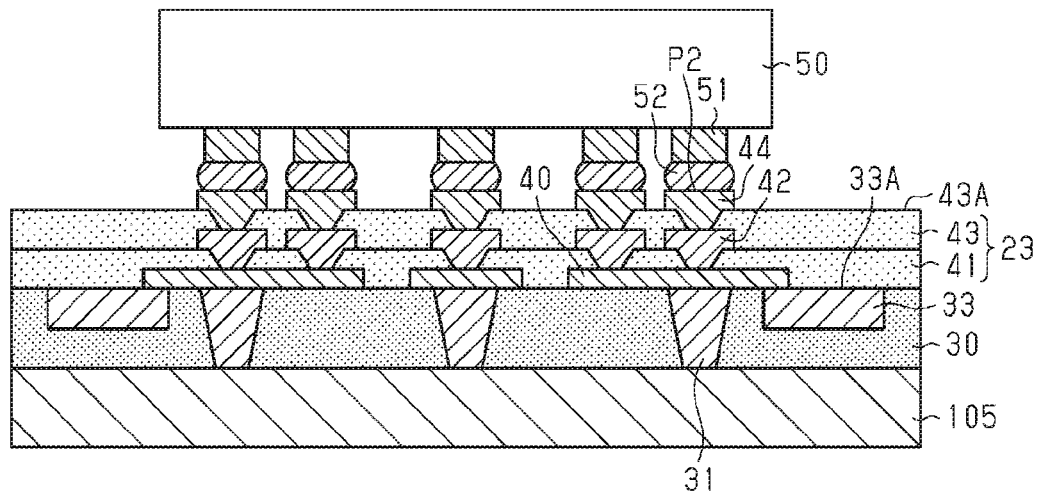

In a step shown in FIG. 7B, a semiconductor chip 50 is first prepared. The semiconductor chip 50 has connection terminals 51 formed on a circuit formation surface, and a bonding member 52 formed on lower surfaces of the connection terminals 51. Successively, the connection terminals 51 of the semiconductor chip 50 are flip-chip bonded on the connection terminals P2. For example, in the case where the bonding member 52 is a solder layer, the connection terminals P2 and the connection terminals 51 are aligned with each other respectively, and then, reflow treatment is performed to melt the bonding member 52 (solder layer) so that the connection terminals 51 can be electrically connected to the connection terminals P2.

Figure 7C:
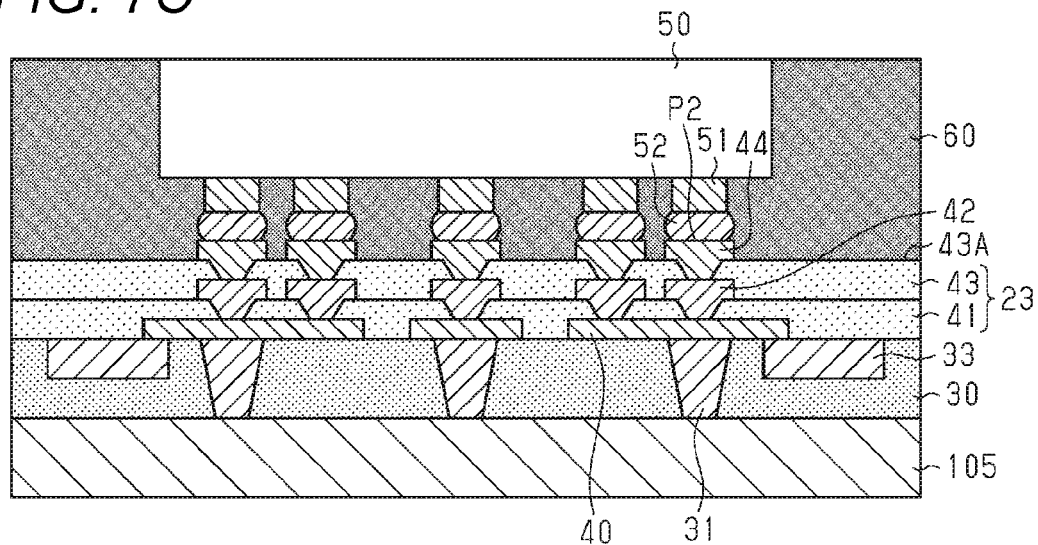

Next, in a step shown in FIG. 7C, a sealing resin 60 for sealing the semiconductor chip 50 is formed on the upper surface 43A of the insulating layer 43. For example, the sealing resin 60 is formed to cover a side surface and the circuit formation surface of the semiconductor chip 50 and cover front surfaces of the connection terminals 51 and the bonding member 52. In this example, the sealing resin 60 is formed to expose a back surface of the semiconductor chip 50. The invention is not limited thereto. The sealing resin 60 may be formed to cover the back surface of the semiconductor chip 50.

For example, assume that a thermosetting molding resin is used as the material of the sealing resin 60. In this case, the structure body shown in FIG. 7B is received in a mold, and the molding resin in a fluidized form is introduced into the mold with pressure (e.g. 5 to 10 MPa) applied thereto. Then, the molding resin is heated and hardened at a temperature of about 180° C. Thus, the sealing resin 60 is formed. Incidentally, for example, a method such as a transfer molding method, a compression molding method or an injection molding method can be used as the method for filling the molding resin.

Figure 8A:
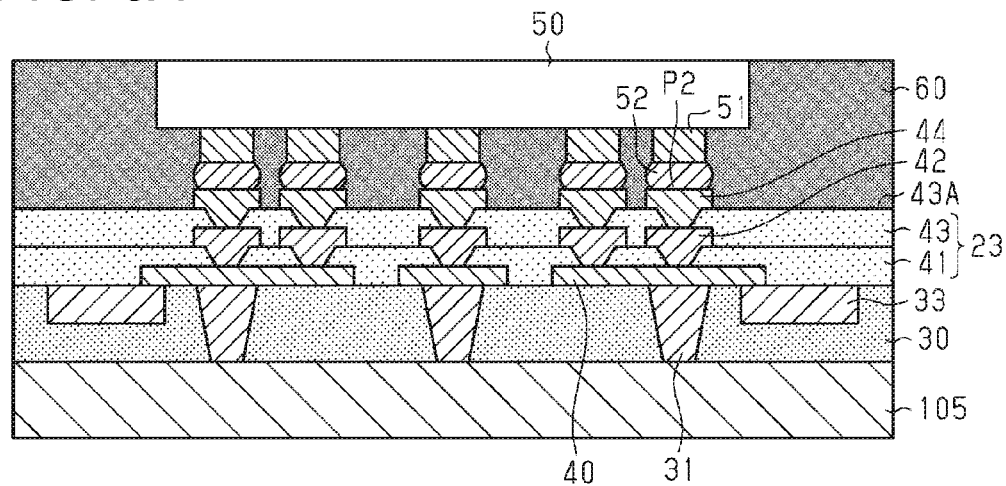
FIGS. 8A to 8C are schematic sectional views showing the method for manufacturing the semiconductor package according to the first embodiment.

Successively, in a step shown in FIG. 8A, the semiconductor chip 50 and the sealing resin 60 are thinned from the upper surface side. For example, the upper surface of the sealing resin 60 and the back surface (upper surface in this case) of the semiconductor chip 50 are ground by back grinding etc., so as to thin down the semiconductor chip 50 and the sealing resin 60. The thickness of the semiconductor chip 50 prior to thinning is, for example, in a range of about 700 to 1,000 µm, whereas the thickness of the semiconductor chip 50 can be changed, for example, to about 200 to 300 µm due to thinning. By this step, the upper surface of the sealing resin 60 and the back surface of the semiconductor chip 50 can be formed to be substantially flush with each other.

Next, the support substrate 105 is removed in the same manner as the step shown in FIG. 4B. On this occasion, when the extremely thin copper foil of the support substrate 105 is removed by wet etching, lower end surfaces of the via wirings 31 (Cu layer) are also etched. Therefore, in the step, etching conditions composition of an etchant, etc. are adjusted so that, for example, an etching amount in each via wiring 31 can be equal to or lower than 0.5 µm. For example, an etchant slow in etching rate can be selected as the etchant.

Figure 8B:
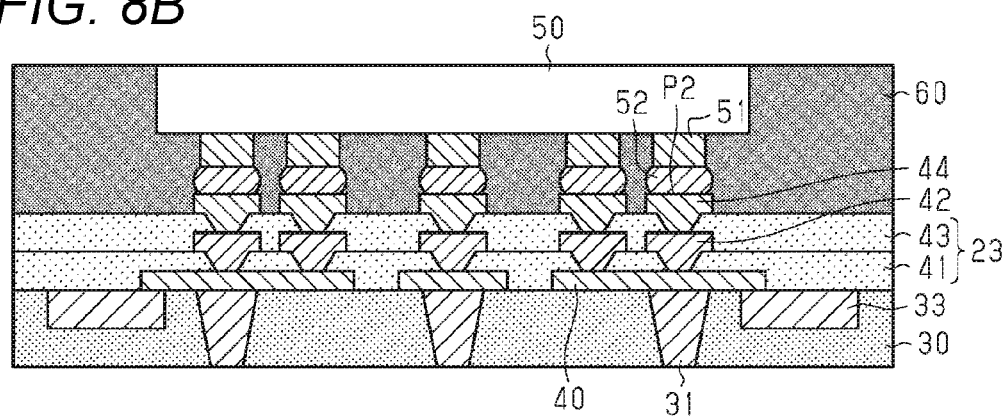

By this step, a lower surface of the insulating layer 30 and the lower end surfaces of the via wirings 31 are exposed to the outside, as shown in FIG. 8B.

Figure 8C:
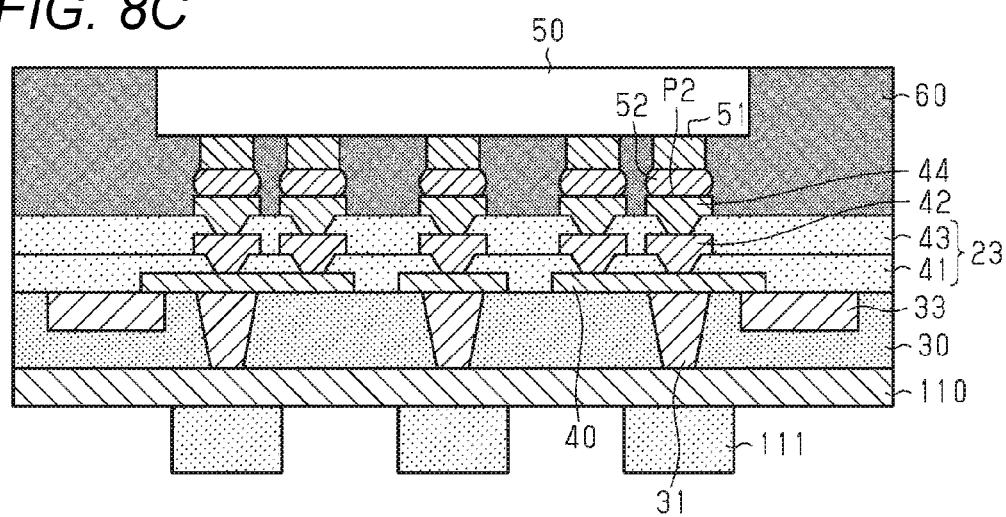

Next, in a step shown in FIG. 8C, a seed layer (not shown) is formed to cover the entire lower surface of the insulating layer 30 and the entire lower end surfaces of the via wirings 31, and electrolytic plating using the seed layer as a power feeding layer is performed. For example, the seed layer is formed by electroless copper plating, and electrolytic copper plating using the seed layer as a power feeding layer is performed. Thus, a metal layer 110 is formed to cover the entire lower surface of the insulating layer 30 and the entire lower end surfaces of the via wirings 31.

Successively, a resist layer 111 is formed on a lower surface of the metal layer 110. The resist layer 111 is formed to cover the lower surface of the metal layer 110 in portions corresponding to a wiring layer 32 (see FIG. 1). As the material of the resist layer 111, for example, a material which is etching-resistant to etching treatment in a next step can be used. For example, the same material as that of the resist layer 103 (see FIG. 3B) can be used as the material of the resist layer 111. In addition, the resist layer 111 can be formed by the same method as the resist layer 103.

Figure 9A:
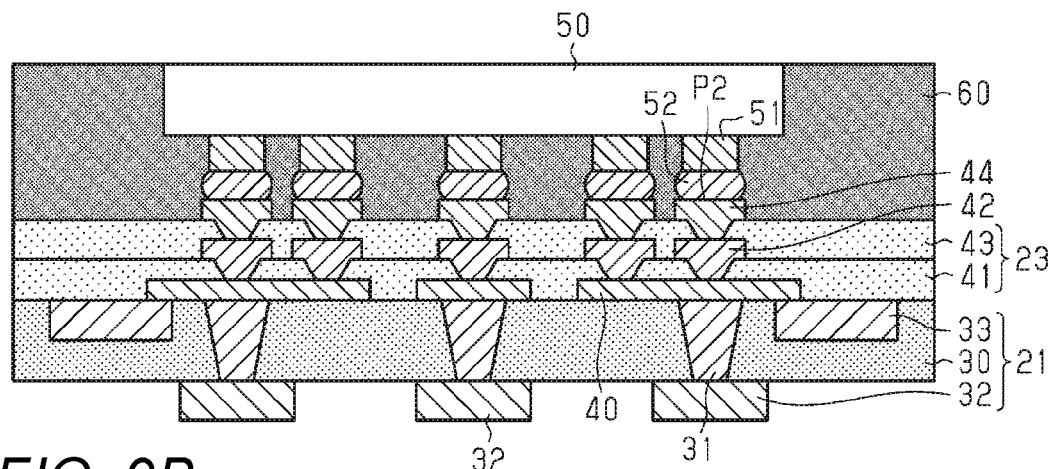
FIGS. 9A to 9C are schematic sectional views showing the method for manufacturing the semiconductor package according to the first embodiment.

Next, the metal layer 110 is etched with the resist layer 111 as an etching mask so that the metal layer 110 is patterned. Thus, the wiring layer 32 making contact with the lower end surfaces of the via wirings 31 is formed on the lower surface of the insulating layer 30, as shown in FIG. 9A. As an etchant used in the etching treatment in this step, for example, an etchant such as a ferric chloride aqueous solution, a cupric chloride aqueous solution, an ammonium persulfate aqueous solution, an ammonium cupric chloride aqueous solution, etc. can be used. In this example, the wiring layer 32 is formed by a subtractive method. However, the wiring layer 32 may be formed by another wiring forming method such as a semi-additive method.

By the aforementioned manufacturing steps, a wiring structure 21 is formed on a lower surface of the wiring structure 23.

Figure 9B:
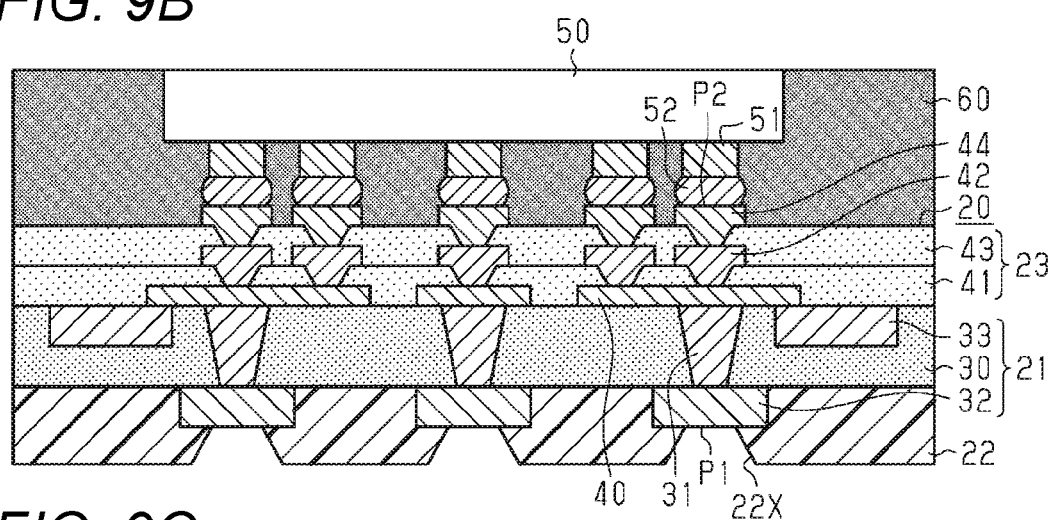

Next, in a step shown in FIG. 9B, a solder resist layer 22 having opening portions 22X for exposing portions of a lower surface of the wiring layer 32 is formed on the lower surface of the insulating layer 30. For example, the solder resist layer 22 can be formed in such a manner that a photosensitive solder resist film is laminated or a liquid solder resist is applied and the resist is patterned into a predetermined shape. Thus, the portions of the lower surface of the wiring layer 32 are exposed as external connection pads P1 from the opening portions 22X of the solder resist layer 22. A surface treatment layer may be formed on the external connection pads P1.

Figure 9C:
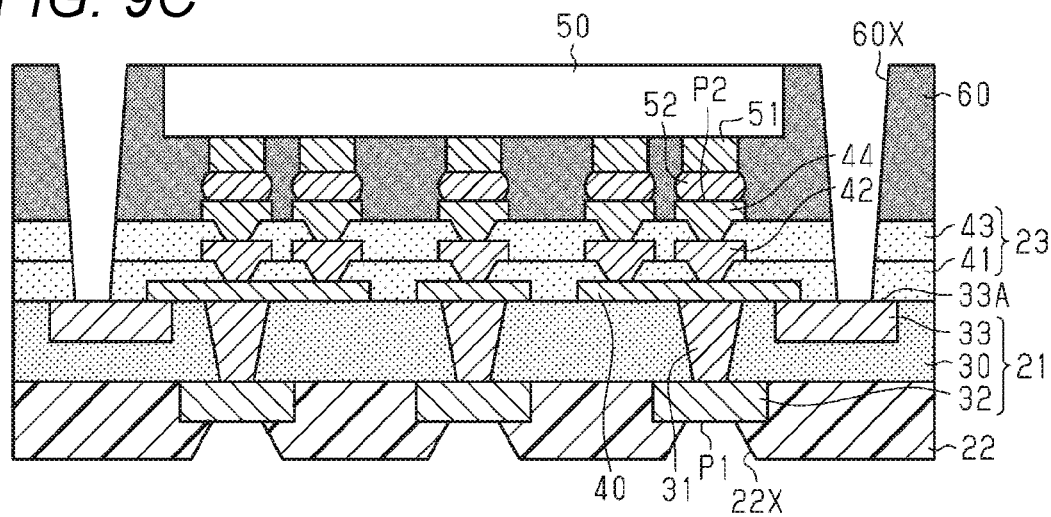

Successively, in a step shown in FIG. 9C, through holes 60X are formed to penetrate the sealing resin 60 and the insulating layer 41 and 43 in the thickness direction to thereby expose portions of the upper surface 33A of the wiring layer 33. For example, the through holes 60X can be formed by laser machining using a $CO_2$ laser, a UV-YAG laser, etc. Next, in the case where the through holes 60X have been formed by laser machining. Besmear treatment is performed to remove resin smears adhering to the exposed surface of the wiring layer 33 exposed in bottom portions of the through holes 60X.

By the aforementioned manufacturing steps, the semiconductor package 10 shown in FIG. 1 can be manufactured.

According to the aforementioned embodiment, the following effects can be obtained.

(1) Each recess portion 30Y is formed in the upper surface 30A of the insulating layer 30 which is made of an insulating resin containing a thermosetting resin as a main component. The wiring layer 33 (pad 34) serving as a POP connection pad is formed in the recess portion 30Y. Therefore, a load which is applied to the wiring layer 33 when another semiconductor package is bonded to the semiconductor package 10 having the wiring layer 33 can be received by the insulating layer 30 made of the thermosetting resin high in mechanical strength. Thus, resin fracture such as cracking can be preferably suppressed from occurring in the insulating layer 30 when an external force is applied to the wiring layer 33.

(2) The wiring layer 33 is received in the recess portion 30Y formed in the upper surface 30A of the insulating layer 30 and embedded in insulating layer 30. With the configuration, the wiring board 20 and the semiconductor package 10 as a whole can be thinned, in comparison with a case where the wiring layer 33 is formed on the upper surface 30A of the insulating layer 30.

In addition, a large load is applied to the wiring layer 33 when another semiconductor package is bonded or when each through hole 60X is formed. Therefore, the wiring layer 33 is required to be thick enough to withstand the large load. According to the embodiment, the wiring layer 33 is embedded in the insulating layer 30 whose thickness as for the insulating resin is set to be thick. With this configuration, the wiring layer 33 can be easily formed to be thick.

(3) The insulating layer 30 is formed to cover the entire side surface and the entire lower surface of the wiring layer 33. Therefore, an interface between the wiring layer 33 and the insulating layer 30 can be increased, in comparison with a case where the wiring layer 33 is formed on the upper surface 30A of the insulating layer 30. Accordingly, for example, thermal stress caused by a difference in coefficient of thermal expansion between the wiring layer 33 and the insulating layer 30 can be dispersed so that stress concentrated on one place can be reduced. As a result, cracking can be preferably suppressed from occurring in the interface between the wiring layer 33 and the insulating layer 30.

(4) The upper surface 30A of the insulating layer 30, the upper end surface 31A of each via wiring 31, and the upper surface 33A of the wiring layer 33 are formed as polished surfaces, and the upper surfaces 30A and 33A and the upper end surface 31A are formed as surfaces smoother than the inner side surface of each through hole 30X of the insulating layer 30. Therefore, for example, a metal film (e.g., the seed layer 107) can be formed uniformly on the upper surface 30A of the insulating layer 30 by sputtering. Accordingly, the seed layer 107 can be formed to be thinner than that in a case where the seed layer 107 is formed on a roughened surface. Further, since the upper surface 30A of the insulating layer 30 is a smooth surface with small unevenness, a residue can be suppressed from occurring when the seed layer 107 is removed by etching, in comparison with a case where the upper surface 30A of the insulating layer 30 is a rough surface with large unevenness. With these configurations, it is possible to easily support miniaturization of the wiring layer even when the miniaturization of the wiring layer stacked on the upper surface 30A of the insulating layer 30 has been advanced.

(5) The coefficient of thermal expansion of the insulating layer 41, the coefficient of thermal expansion of the solder resist layer and the coefficient of thermal expansion of the sealing resin 60 are adjusted to be equal to one another. Thus, for example, physical properties (the coefficient of thermal expansion, etc.) of upper and lower portions with respect to the wiring structure 23 can be balanced well. That is, when the semiconductor package 10 is seen in an up/down direction (stacking direction), the distribution of the physical properties can approximate vertical symmetry with respect to the wiring structure 23. Therefore, warp or undulation can be preferably suppressed from occurring in the semiconductor package 10.

(6) The lowermost wiring layer 40 of the wiring structure 23 is formed on the upper surface 30A of the insulating layer 30 so as to make contact with the upper surface 33A of the wiring layer 33 used for POP. That is, the wiring layer 40 and the wiring layer 33 are connected to each other directly without the interposition of the via wirings etc. therebetween. Thus, the degree of freedom for the connection form between the wiring layer 40 and the wiring layer 33 can be improved.

Figure 10A:
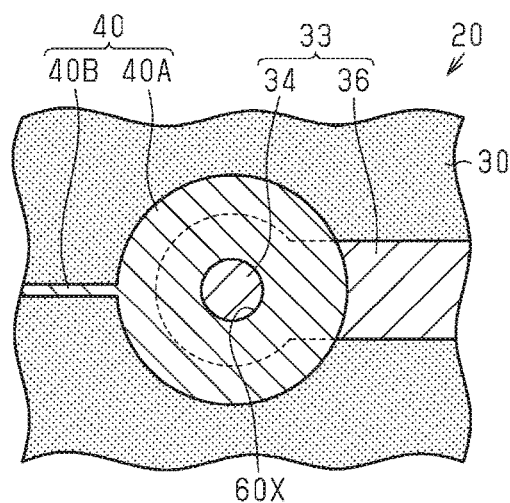
FIG. 10A is a schematic plan view showing a portion of a semiconductor package according to a modification.
Figure 10B:
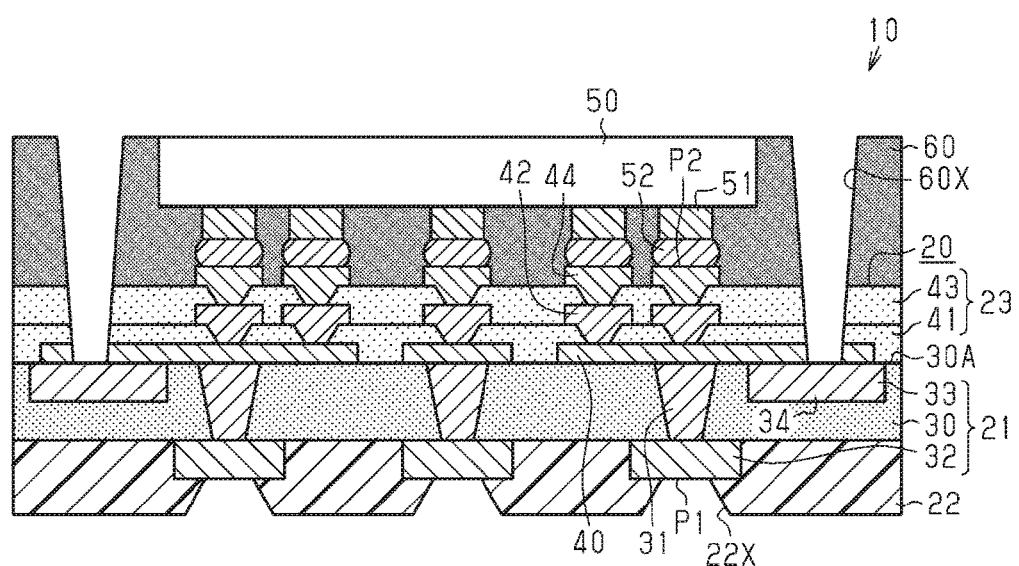
FIG. 10B is a schematic sectional view showing the semiconductor package according to the modification.
Figure 11A:
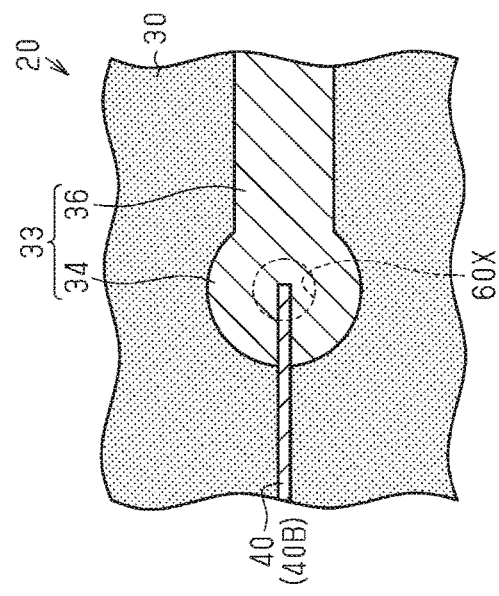
FIG. 11A is a schematic plan view showing a portion of a semiconductor package according to a modification.
Figure 11B:
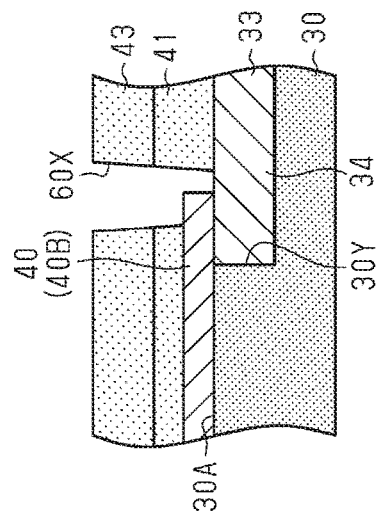
FIG. 11B is a schematic sectional view showing the portion of the semiconductor package according to the modification.

For example, as shown in FIG. 10A, the lower surface of the wiring layer 40 may be formed to make contact with the entire upper surface of the pad 34 of the wiring layer 33. In this case, for example, the through hole 60X is formed to penetrate the sealing resin 60, the insulating layers 41 and 43 and the wiring layer 40 in the thickness direction, as shown in FIG. 10B. On this occasion, a portion of the wiring layer 40 (pad 40A) may protrude inside the through hole 60X in the bottom portion of the through hole 60X, as shown in FIGS. 11A and 11B. For example, the wiring layer 40 in this case is formed to protrude in a ring shape inside the through hole 60X in the bottom portion of the through hole 60X. Therefore, the portion of the wiring layer 40 is exposed from the through hole 60X, as shown in FIG. 11B. In the examples shown in FIGS. 10A and 10B and FIGS. 11A and 11B, the pad 35 shown in FIG. 2 or the circuit pattern 36 shown in FIGS. 10A and 11A can be omitted. Accordingly, it is possible to make contribution to reduction in the size of the wiring board 20. In addition, in a case were a through electrode is formed inside the through hole 60X, the through electrode and the wiring layer 40 may be connected to each other directly.

In addition, as shown in FIGS. 12A and 12B, FIG. 13 and FIGS. 14A and 14B, the pad 40A (see FIGS. 11A and 11B) of the wiring layer 40 may be omitted so that a lower surface of the circuit pattern 40B of the wiring layer 40 can be formed to make contact with the upper surface of the wiring layer 33. For example, the lower surface of the wiring layer 40 (circuit pattern 40B) can be formed to make contact with a portion of the upper surface of one of the pads 34 and 35 and the circuit pattern 36 of the wiring layer 33. In this case, a portion of the circuit pattern 40B narrower in width than the circuit pattern 36 can be brought into contact with the wiring layer 33 so that a contact area between the circuit pattern 40B and the wiring layer 33 can be smaller. Since the pad 40A (FIGS. 11A and 11B) having a large planar shape can be omitted, it is possible to make contribution to reduction in the size of the wiring board 20.

Figure 12A:
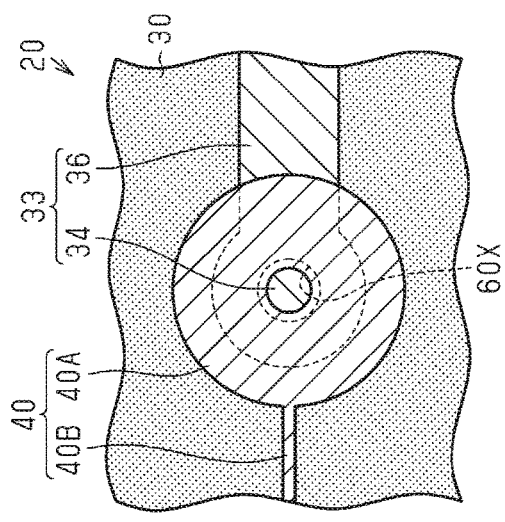
FIG. 12A is a schematic plan view showing a portion of a semiconductor package according to a modification.
Figure 12B:
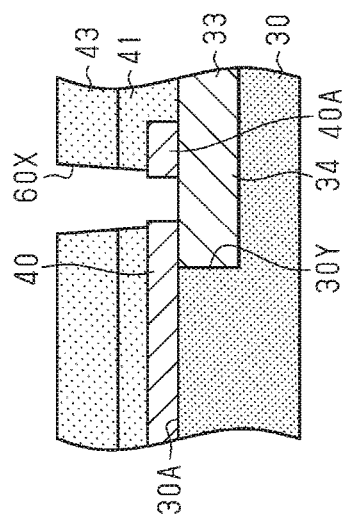
FIG. 12B is a schematic sectional view showing the portion of the semiconductor package according to the modification.

For example, as shown in FIG. 12A and FIG. 12B, the lower surface of the wiring layer 40 (circuit pattern 40B) may be formed to make contact with a portion of the upper surface of the pad 34 of the wiring layer 33. A portion of the wiring layer 40 in the modification is exposed in the bottom portion of the through hole 60X. However, the wiring layer 40 may be not exposed in the bottom portion of the through hole 60X. Incidentally, the pad 35 shown in FIG. 2 or the circuit pattern 36 shown in FIG. 12A may be omitted in this case.

Figure 13:
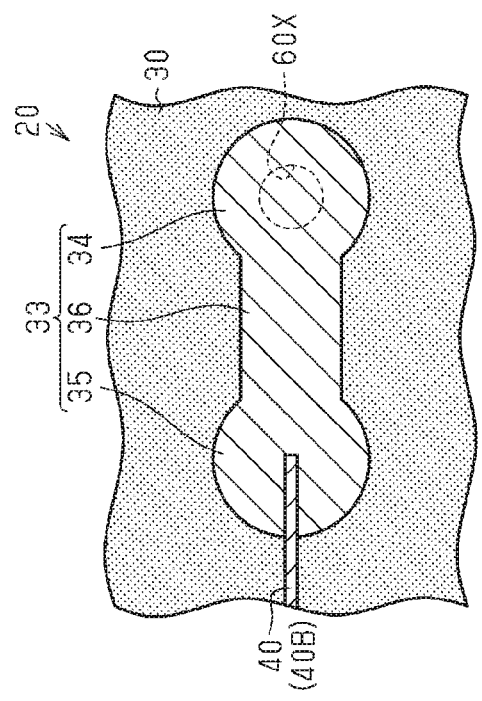
FIG. 13 is a schematic plan view showing a portion of a semiconductor package according to a modification.

As shown in FIG. 13, the lower surface of the wiring layer 40 (circuit pattern 40B) may be formed to make contact with a portion of the upper surface of the pad 35 of the wiring layer 33.

Figure 14A:
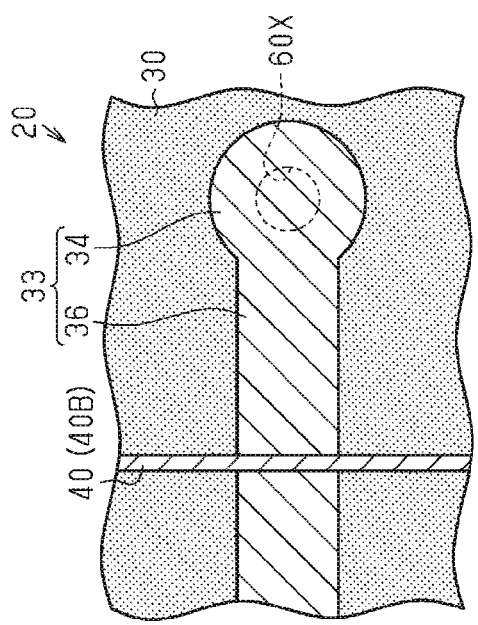
FIG. 14A is a schematic plan view showing a portion of a semiconductor package according to a modification.
Figure 14B:
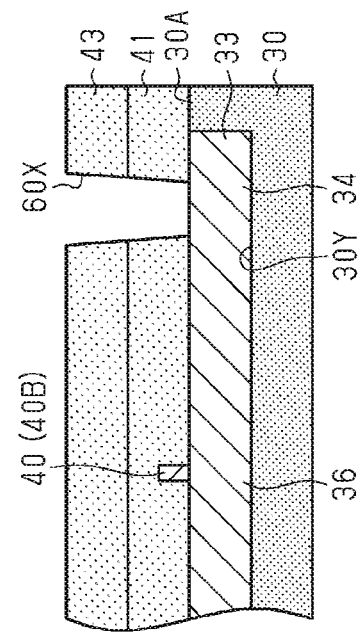
FIG. 14B is a schematic sectional view showing the portion of the semiconductor package according to the modification.

Alternatively, as shown in FIG. 14A and FIG. 14B, the lower surface of the wiring layer 40 (circuit pattern 40B) may be formed to make contact with a portion of the upper surface of the circuit pattern 36 of the wiring layer 33. For example, as shown in FIG. 14A, the circuit pattern 40B may be formed to cross the circuit pattern 36 so that the lower surface of the circuit pattern 40B and the upper surface of the circuit pattern 36 can be connected to each other at the crossing portion. Incidentally, the pad 35 shown in FIG. 2 may be omitted in this case.

As described above, the wiring layer 40 and the wiring layer 33 are connected to each other directly without the interposition of the via wirings etc. therebetween. Thus, the connection form between the wiring layer 40 and the wiring layer 33 can be selected from various connection forms.

Second Embodiment

A second embodiment will be described below with reference to FIG. 15, FIG. 16, FIGS. 17A and 17B, and FIGS. 18A and 18B. Members the same as the members Previously described in FIG. 1. FIG. 2, FIGS. 3A to 3D, FIGS. 4A to 4D, FIGS. 5A to 5D, FIGS. 6A to 6D, FIGS. 7A to 7C, FIGS. 8A to 8C, FIGS. 9A to 9C, FIGS. 10A and 10B, FIGS. 11A and 11B, FIGS. 12A and 12B, FIG. 13 and FIGS. 14A and 14B will be referred to by the same signs respectively and correspondingly, and detailed description about the respective members will be omitted.

Figure 15:
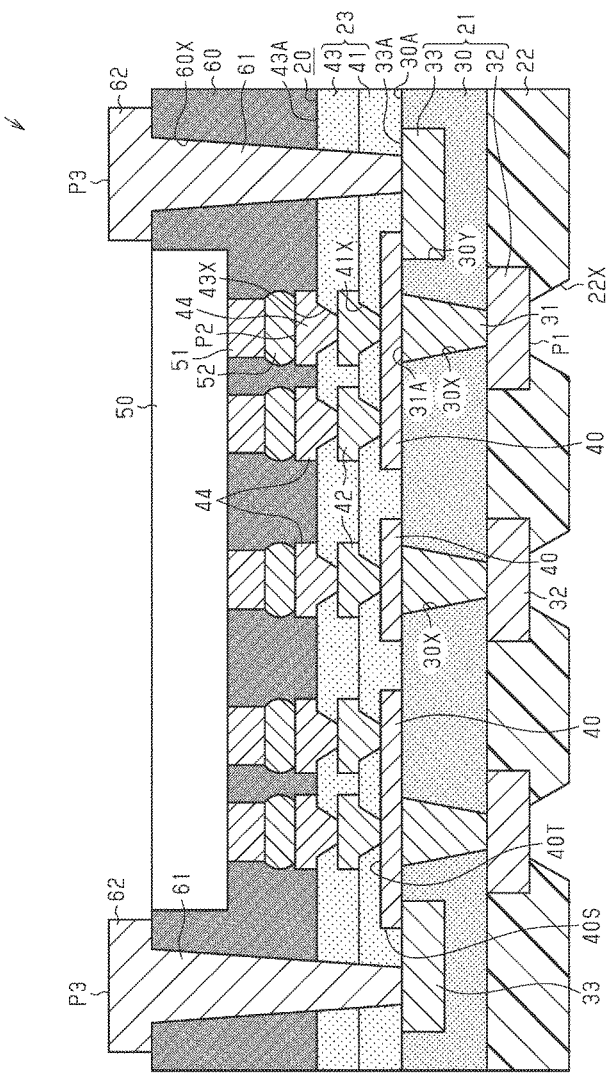
FIG. 15 is a schematic sectional view showing a semiconductor package according to a second embodiment.

As shown in FIG. 15, in a semiconductor package 10A, through electrodes 61 for making electric connection between a wiring layer 62 and a wiring layer 33 are filled in through holes 60X. The wiring layer 62 serves as connection pads P3. Each of the through electrodes 61 is formed to penetrate a sealing resin 60 and insulating layers 41 and 43 in a thickness direction.

The wiring layer 62 electrically connected to the wiring layer 33 through the through electrodes 61 is formed on an upper surface of the sealing resin 60. For example, the wiring layer 62 is formed integrally with the through electrodes 61. On this occasion, the wiring layer 62 serves as the connection pads P3 to be electrically connected to another semiconductor package 70 (see FIG. 16). In this manner, the wiring layer 33 (pads 34) used for POP is electrically connected to an electronic component such as another wiring board (semiconductor package) or a semiconductor chip through the through electrodes 61 and the wiring layer 62 (connection pads P3) in the semiconductor package 10A.

Incidentally, if occasions demand, a surface treatment layer may be formed on front surfaces (upper surfaces and side surfaces or only upper surfaces) of the connection pads P3. As the surface treatment layer, for example, a surface treatment layer the same as that formed on external connection pads P1 can he used.

For example, the connection pads P3 are disposed peripherally in a plan view. Each of the connection pads P3 can be formed into any planar shape and with any size. For example, the planar shape of the connection pad P3 can be formed as a circular shape having a diameter in a range of about 300 to 500 μm.

Figure 16:
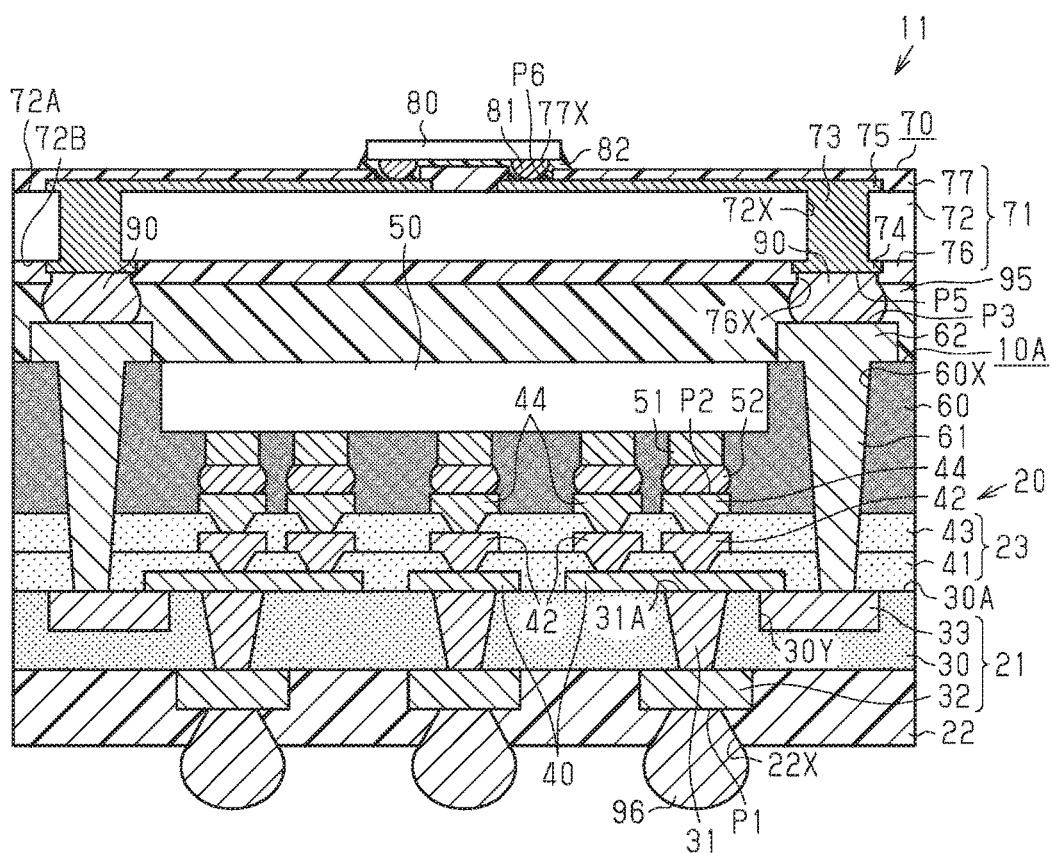
FIG. 16 is a schematic sectional view showing a semiconductor device according to the second embodiment.

Next, the structure of a semiconductor device 11 will be described in accordance with FIG. 16.

The semiconductor device 11 has a semiconductor package 10A, a semiconductor package 70, a sealing resin 95, and external connection terminals 96. The semiconductor package 70 is bonded to the semiconductor package 10A. The sealing resin 95 is formed between the semiconductor packages 10A and 70.

The semiconductor package 70 has a wiring board 71, one or a plurality of semiconductor chips 80, and an underfill resin 82. Each semiconductor chip 80 is flip-chip mounted on the wiring board 71. The underfill resin 82 is formed between the wiring board 71 and the semiconductor chip 80.

The wiring board 71 has a core substrate 72, through electrodes 73 provided in the core substrate 72, a lowermost wiring layer 74, an uppermost wiring layer 75, and solder resist layers 76 and 77. The core substrate 72 is provided in the vicinity of the thicknesswise center of the wiring board 71. Through holes 72X are provided at certain places (two places in FIG. 16) in the core substrate 72 to penetrate the core substrate 72 ranging from an upper surface 72A up to a lower surface 72B. The through electrodes 73 are formed inside the through holes 72X to penetrate the core substrate 72 in the thickness direction.

The wiring layer 74 is formed on the lower surface 72B of the core substrate The wiring layer 75 is formed on the upper surface 72A of the core substrate 72. The wiring layers 74 and 75 are electrically connected to each other through the through electrodes 73. The solder resist layer 76 is formed on the lower surface 729 of the core substrate 72 so as to cover a portion of the wiring layer 74. Opening portions 76X for exposing portions of the wiring layer 74 as connection pads P5 are formed in the solder resist layer 76. The connection pads P5 are provided to be opposed to connection pads P3 formed in the semiconductor package 10A respectively.

On the other hand, the solder resist layer 77 is formed on the upper surface 72A of the core substrate 72 so as to cover a portion of the wiring layer 75. Opening portions 77X for exposing portions of the wiring layer 75 as connection pads P6 are formed in the solder resist layer 77.

When bumps 81 provided on a circuit formation surface (lower surface in FIG. 16) of the semiconductor chip 80 are bonded to the connection pads P6, the semiconductor chip 80 is electrically connected to the wiring layer 75 through the bumps 81. The underfill resin 82 is provided to fill a gap between the wiring board 71 and the semiconductor chip 80.

Solder balls 90 are bonded on the connection pads P3 of the semiconductor package 10A. The solder balls 90 are provided to be interposed between the semiconductor package 10A and the semiconductor package 70. Each of the solder balls 90 has one end bonded to the connection pad P3 and the other end bonded to the connection pad P5. The solder halls 90 serve as connection terminals for making connection between the semiconductor package 10A and the semiconductor package 70.

In this manner, the semiconductor package 10A and the semiconductor package 70 are formed and bonded on each other through the solder balls 90. Thus, the semiconductor device 11 having a POP structure is formed.

The space between the semiconductor package 10A and the semiconductor package 70 is tilled with the sealing resin 95. By the sealing resin 95, the semiconductor package 70 is fixed to the semiconductor package 10A, and the semiconductor chip 50 mounted on the wiring board 20 is sealed. That is, the sealing resin 95 serves as an adhesive agent for adhesively bonding the semiconductor package 10A and the semiconductor package 70 to each other, and serves as a protective layer for protecting the semiconductor chip 50.

Further, with the provision of the sealing resin 95, mechanical strength of the semiconductor device 11 as a whole can be enhanced.

Incidentally, as the material of the sealing resin 95, for example, an insulating resin such as an epoxy resin or a polyimide resin, or any of resin materials in which a filler such as silica or alumina is mixed into these aforementioned resins can be used. For example, a molding resin or an underfill material can be used as the sealing resin 95.

The external connection terminals 96 are formed on the external connection pads P1 of the wiring board 20. For example, the external connection terminals 96 are connection terminals which can be electrically connected to pads provided in a mount board (not shown) such as a motherboard. For example, solder balls or lead pins can be used as the external connection terminals 96. Incidentally, solder balls are used as the external connection terminals 96 in this example.

Next, a method for manufacturing the semiconductor package 10A will be described in accordance with FIGS. 17A and 17B. In the method for manufacturing the semiconductor package 10A, steps after the step shown in FIG. 9C will be carried out as follows.

Figure 17A:
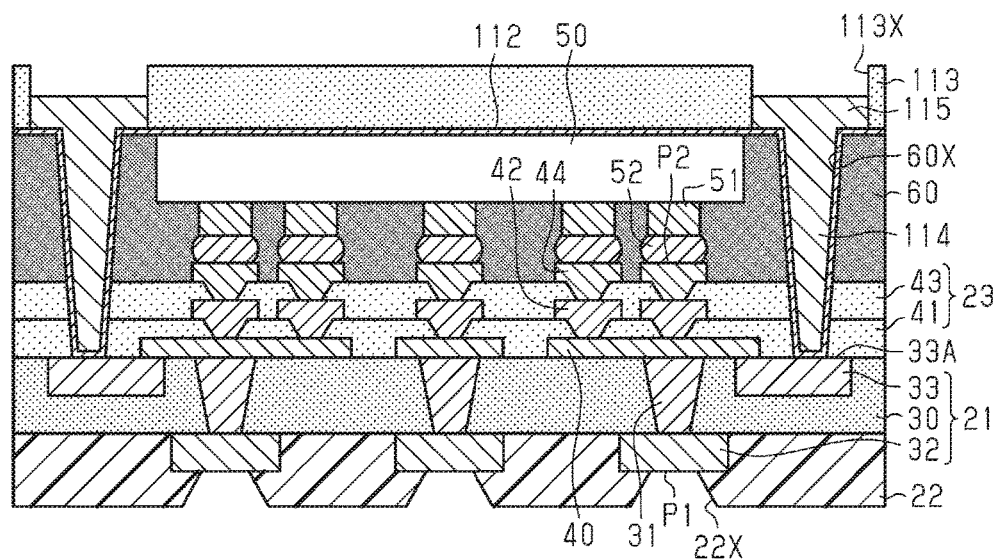
FIGS. 17A and 17B are schematic sectional views showing a method for manufacturing the semiconductor package according to the second embodiment.
Figure 17B:
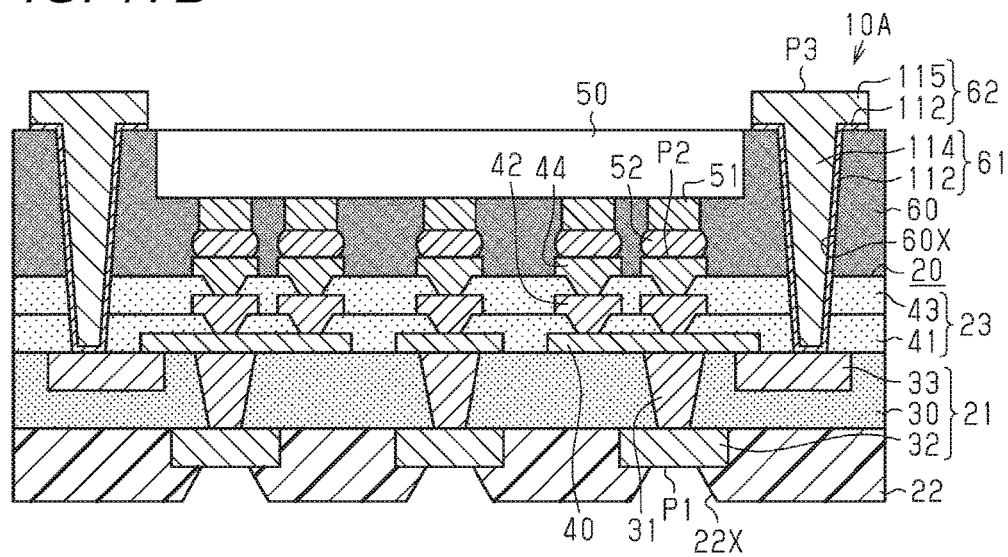

Next, in a step shown in FIG. 17A, a seed layer 112 is formed in the same manner as in the step shown in FIG. 5C so as to cover the entire front surface of the sealing resin 60 including the inner side surfaces of the through holes 60X, the entire upper surface 33A of the wiring layer 33 exposed from the through holes 60X and the entire back surface of the semiconductor chip 50. For example, the seed layer 112 can be formed by sputtering or electroless plating. For example, a seed layer having a two-layer structure (Ti layer/Cu layer) a one-layer structure (Cu layer) can be used as the seed layer 112.

Successively, a resist layer 113 having opening patterns 113X exposing the seed layer 112 in portions corresponding to regions where the wiring layer 62 (see FIG. 15) should be formed is formed on the seed layer 112 in the same manner as in the step shown in FIG. 5D. Next, electrolytic plating (electrolytic copper plating in this case) using the seed layer 112 as a plating power feeding layer is carried out with the resist layer 113 as a plating mask. Thus, a metal layer 114 is formed to till the through holes 60X on an inner side than the seed layer 112, and a metal layer 115 is formed on the metal layer 114 and the seed layer 112. Successively, after the resist layer 113 is removed, for example, by an alkaline release agent, an unnecessary portion of the seed layer 112 is removed by etching with the metal layer 115 as a mask. Thus, as shown in FIG. 17B, through electrodes 61 constituted by the seed layer 112 and the metal layer 114 which cover the inner side surfaces of the through holes 60X are formed inside the through holes 60X. In addition, the wiring layer 62 which is constituted by the seed layer 112 and the metal layer 115 formed on the upper surface of the sealing resin 60 and which serves as connection pads P3 is formed on the sealing resin 60.

By the aforementioned manufacturing steps, the semiconductor package 10A shown in FIG. 15 can be manufactured.

Next, a method for manufacturing the semiconductor device 11 will be described in accordance with FIGS. 18A and 18B.

Figure 18A:
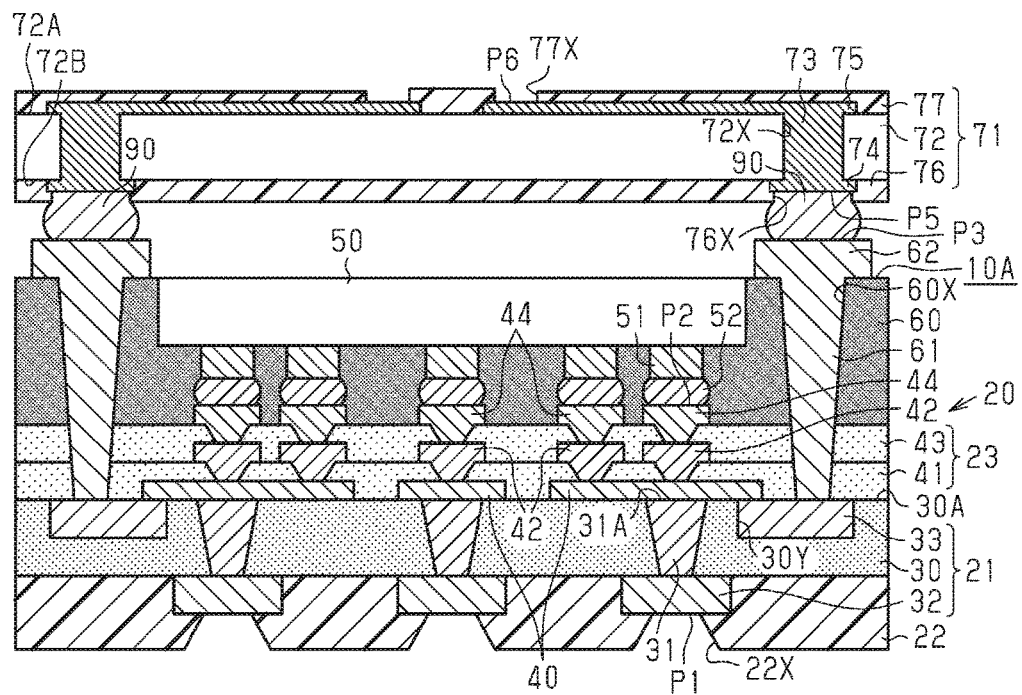
FIGS. 18A and 18B are schematic sectional views showing a method for manufacturing the semiconductor device according to the second embodiment.

First, in a step shown in FIG. 18A, a wiring board 71 is prepared. Successively, solder balls 90 are mounted (bonded) on the connection pads P3 of the semiconductor package 10A or on connection pads P5 of the wiring board 71. For example, after flux is suitably applied onto the connection pads P5, the solder balls 90 are mounted on the connection pads P5 and fixed thereon by reflow at a temperature of about 230 to 260° C. In the case where the flux has been applied, the front surface is then cleaned to remove the flux. Next, the wiring board 71 mounted with the solder balls 90 is positioned on the semiconductor package 10A, and the solder balls 90 are bonded on the connection pads P3. Specifically, first, flux is suitably applied to the connection pads P3. Then, the wiring board 71 is disposed on the semiconductor package 10A while interposing the solder balls 90 therebetween. The semiconductor package 10A and the wiring board 71 are heated in a reflow furnace at a temperature of about 230 to 260° C. Thus, the solder balls 90 are melted so that the solder balls 90 can be bonded to the connection pads P3. Thus, the connection pads P3 and the connection pads P5 are electrically connected to each other respectively through the solder balls 90, and the wiring board 71 is fixed onto the semiconductor package 1.0A through the solder balls 90.

Here, a load applied to the connection pads P3 of the semiconductor package 10A in this step is larger than a load applied to the connection pads P2 when the semiconductor chip 50 is flip-chip mounted. Therefore, resin fracture such as cracking is apt to occur in the connection pads P3 and the insulating layer receiving the load of the wiring layer 33. To solve this problem, according to the embodiment, the connection pads P3 are formed on the sealing resin 60 higher in mechanical strength than a photosensitive resin, and the wiring layer 33 is formed in the insulating layer 30 higher in mechanical strength than the photosensitive resin. Therefore, a load applied to the connection pads P3 and the wiring layer 33 when the wiring board 71 is bonded can be received by the sealing resin 60 and the insulating layer 30 both high in mechanical strength. Thus, resin fracture such as cracking can be preferably suppressed from occurring in the sealing resin 60 and the insulating layer 30 when the wiring board 71 is bonded on the semiconductor package 10A.

Figure 18B:
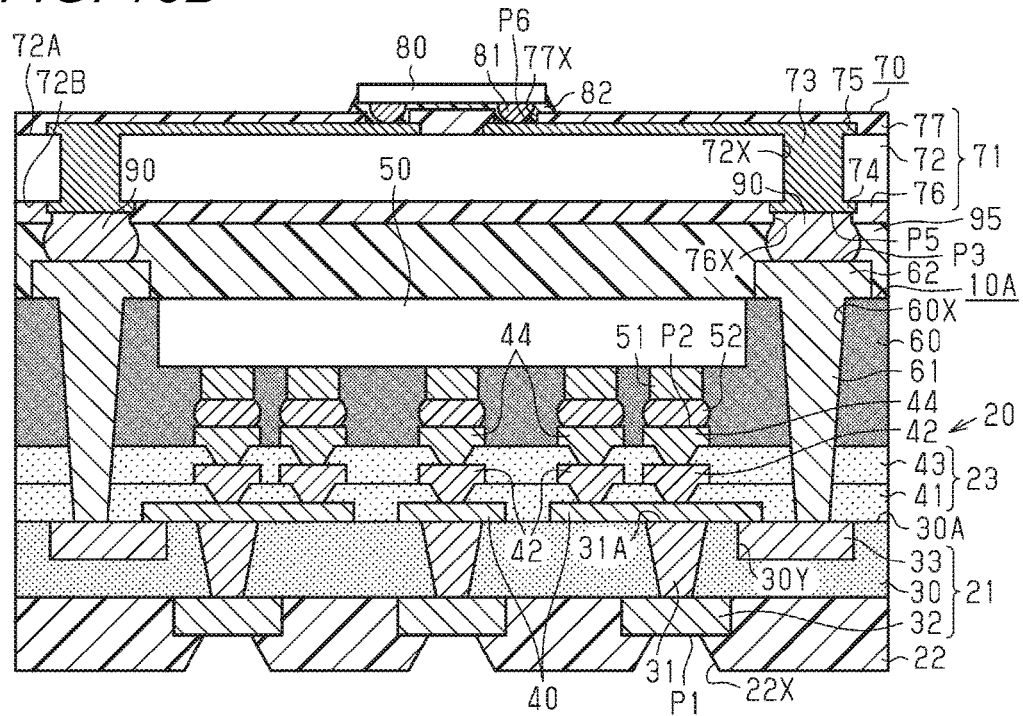

Next, in a step shown in FIG. 18B, a sealing resin 95 is formed in the same manner as in the step shown in FIG. 7C to fill a space between the semiconductor package 10A and the wiring board 71. The semiconductor package 10A and the wiring board 71 can be fixed firmly by the sealing resin 95.

Successively, bumps 81 of a semiconductor chip 80 are flip-chip bonded on the connection pads P6 of the wiring board 71. Then, an underfill resin 82 is filled between the semiconductor chip 80 and the wiring board 71 which are flip-chip bonded to each other. The underfill resin 82 is hardened.

By the aforementioned manufacturing steps, a semiconductor package 70 is manufactured and the semiconductor package 70 is stacked and bonded on the semiconductor package 10A.

Then, external connection terminals 96 (see FIG. 16) are formed on the external connection pads P1 of the semiconductor package 10A. By the aforementioned manufacturing steps, the semiconductor device 11 shown in FIG. 16 can be manufactured.

According to the aforementioned embodiment, the following effect can be obtained in addition to the effects (1) to (6) of the first embodiment.

(7) The connection pads P3 are formed on the upper surface of the sealing resin 60 higher mechanical characteristic than the insulating layer 41 which contains a photosensitive resin as a main component, and another semiconductor package 70 is electrically connected to the POP wiring layer 33 (pads 34) through the connection pads P3 and the through electrodes 61. With this configuration, a load applied to the POP wiring layer 33 (pads 34) when the other semiconductor package 70 is bonded to the connection pads P3 of the semiconductor package 10A can be therefore received not only by the insulating layer 30 but also by the sealing resin 60 high in mechanical strength. Thus, the load applied to the wiring layer 33 (pads 34) can be also dispersed to the sealing resin 60. Accordingly, resin fracture such as cracking can be further suppressed from occurring in the insulating layer 30 when an external force is applied to the wiring layer 33 (pads 34).

Other Embodiments

Incidentally, the aforementioned embodiments may be changed suitably and carried out in the following modes.

The through electrodes 61 filled in the through holes 60X and the wiring layer 62 formed on the upper surface of the sealing resin 60 may be provided in any of the semiconductor packages 10 according to the modifications shown in FIGS. 10A and 10B, FIGS. 11A and 11B, FIGS. 12A and 12B, FIG. 13 and FIGS. 14A and 14B.

In the aforementioned second embodiment, the through electrodes 61 for making electric connection between the wiring layer 62 serving as the connection pads P3 and the wiring layer 33 are formed to till the through holes 60X.

Figure 19:
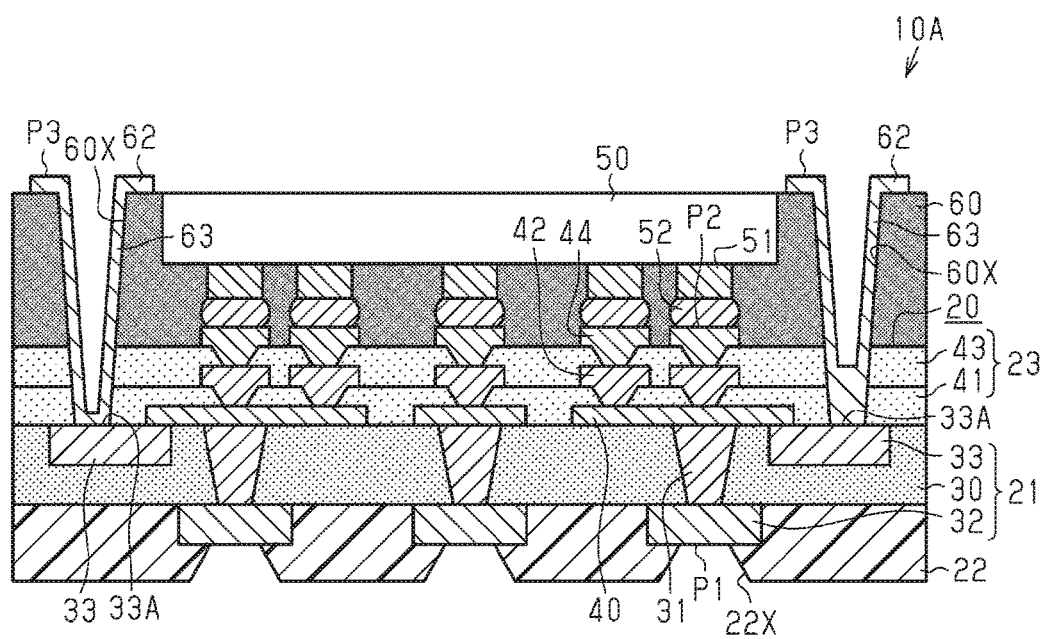
FIG. 19 is a schematic sectional view showing a semiconductor package according to a modification.

The invention is not limited thereto. For example, as shown in FIG. 19, each connection pad P3 and the wiring layer 33 may be electrically connected to each other through a corresponding through electrode 63 which is formed along the inner surface of a corresponding through hole 60X (the inner side surface of the through hole 60X and the upper surface 33A of the wiring layer 33 exposed in the bottom portion of the through hole 60X). On this occasion, as shown on the right side of FIG. 19, the through electrode 63 may be formed so that a portion of the through electrode 63 formed on the bottom portion of the through hole 60X can be thicker than a portion of the through electrode 63 formed on the inner side surface of the through hole 60X. Incidentally, the connection pad P3 (wiring layer 62) in this case is formed on the upper surface of the sealing resin 60 and, for example, substantially into an annular shape (ring shape) in a plan view.

Figure 20:
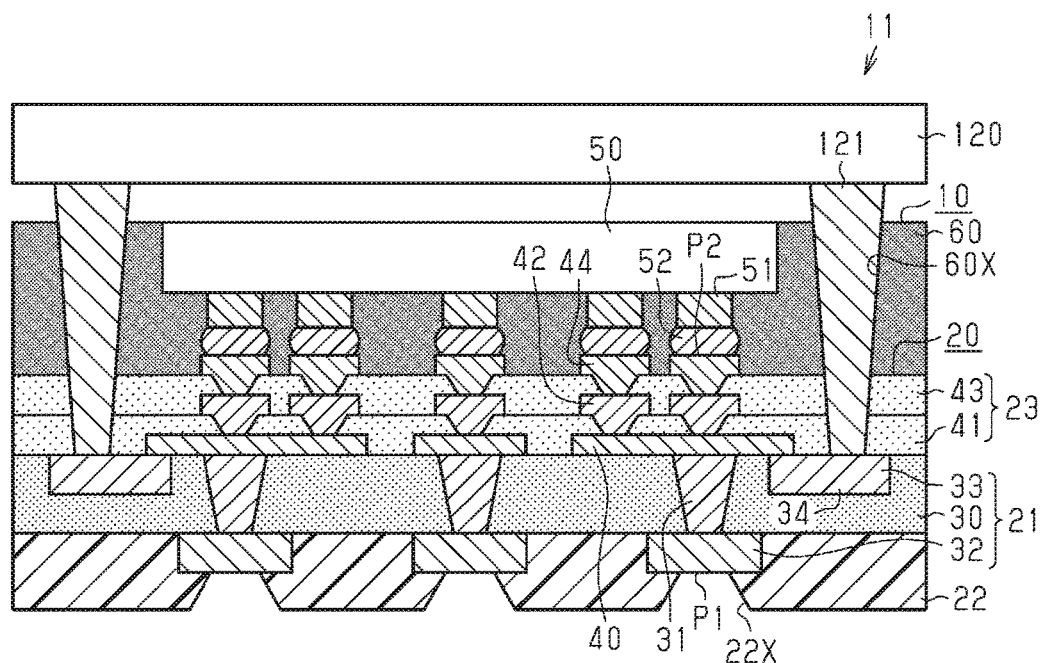
FIG. 20 is a schematic sectional view showing a semiconductor device according to the modification.

As shown in FIG. 20, connection terminals 121 which are formed on another semiconductor package 120 may be connected to the wiring layer 33 (pads 34). Thus, the semiconductor package 120 is stacked and bonded on the semiconductor package 10. On this occasion, an electrically conductive adhesive agent, a solder layer, etc. may be interposed between the wiring layer 33 (pads 34) and the semiconductor terminals 121. Incidentally, a wiring board mounted with a semiconductor chip or a function element may be used as the semiconductor package 120.

Figure 21:
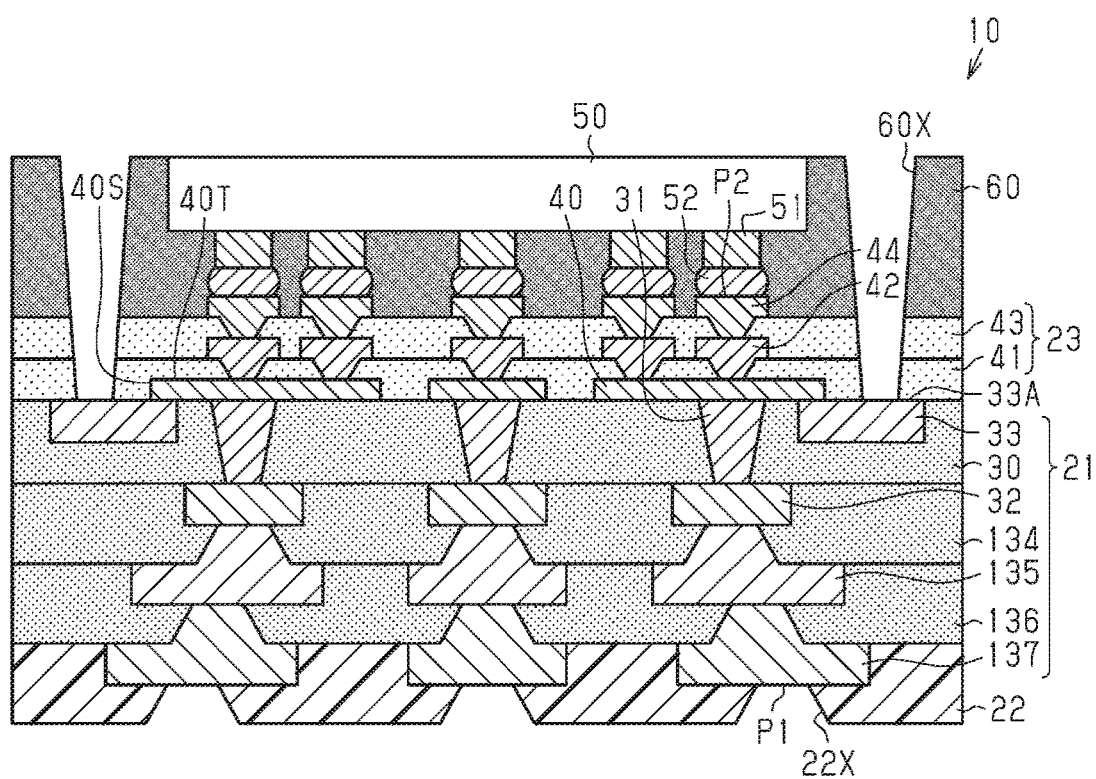
FIG. 21 is a schematic sectional view showing a semiconductor package according to a modification.

The numbers of the wiring layers 32, the via wirings 31 and the insulating layers 30, wiring routing etc. in the wiring structure 21 according to each of the aforementioned embodiments can be modified or changed variously. For example, a plurality of wiring layers and a plurality of insulating layers may be stacked on the lower surface of the insulating layer 30, For example, as shown in FIG. 21, a wiring layer 32, an insulating layer 134, a wiring layer 135, an insulating layer 136, and a wiring layer 137 may be formed in the named order on a lower surface of an insulating layer 30 in a wiring structure 21. A solder resist layer 22 in this case is formed on a lower surface of the lowermost insulating layer 136 of the wiring structure 21 so as to cover a portion of the lowermost wiring layer 137 of the wiring structure 21.

Opening portions 22X for exposing portions of the lowermost wiring layer 137 as external connection pads P1 are formed in the solder resist layer 22.

The number of the wiring layers 40, 42 and 44, the number of the insulating layers 41 and 43, wiring routing, etc. in the wiring structure 23 according to each of the aforementioned embodiments can be modified or changed variously.

In each of the aforementioned embodiments, the sealing resin 60 is formed to expose the back surface of the semiconductor chip 50. The present disclosure is not limited thereto. The sealing resin 60 may be formed to cover the back surface of the semiconductor chip 50.

In the semiconductor package 10, 10A according to each of the aforementioned embodiments, the semiconductor chip 50 is mounted on the wiring board 20. The invention is not limited thereto. For example, an electronic component such as a chip component such as a chip capacitor, a chip resistor or a chip inductor, or a crystal oscillator may be used in place of the semiconductor chip 50 and mounted on the wiring board 20.

In addition, a mounting form (e.g. flip-chip mounting, wire bonding mounting, solder mounting or a combination of the aforementioned mountings) etc. of the semiconductor chip 50 or the electronic component such as the chip component or the crystal oscillator can be modified or changed variously.

The sealing resin 95 in the semiconductor device 11 according to the aforementioned second embodiment may be omitted.

In the aforementioned second embodiment, the solder balls 90 are used as connection terminals for making connection between the semiconductor package 10A and the semiconductor package 70. The present disclosure is not limited thereto. For example, metal posts which are columnar connection terminals, connection terminals having spring properties (spring connection terminals), etc. may be used as connection terminals for making connection between the semiconductor package 10 and the semiconductor package 70.

In the wiring board 71 according to the aforementioned second embodiment, the structure of inner layers than the outermost wiring layers 74 and 75 is not limited particularly. That is, it will be sufficient if the wiring board 71 has a structure in which at least the outermost wiring layers 74 and 75 are electrically connected to each other through the inside of the board. Accordingly, the structure of inner layers than the outermost wiring layers 74 and 75 in the wiring board 71 is not limited particularly. For example, a required number of wiring layers and a required number of insulating layers may be stacked on the upper surface 72A and the lower surface 72B of the core substrate 72. Alternatively, the wiring board 71 may be used as a coreless board excluding the core substrate 72.

The sectional shape of each through hole formed in the semiconductor package 10, 10A, 70 in each of the aforementioned embodiments is not limited particularly. For example, the through hole formed in the semiconductor package 10, 10A, 70 may be formed into a straight shape (substantially rectangular shape in sectional view).

In each of the aforementioned embodiments, the wiring layer 32 is formed on the lower surface of the insulating layer 30 after the support substrate 105 is removed in the step shown in FIG. 8B. The present disclosure is not limited thereto. For example, the support substrate 105 formed on the lower surface of the insulating layer 30 does not have to be removed but may be patterned in order to form the wiring layer 32.

In the method for manufacturing the semiconductor package 10, 10A according to each of the aforementioned embodiments, the step for thinning the semiconductor chip 50 and the sealing resin 60 from the upper surface side may be omitted.

In the method for manufacturing the semiconductor package 10, 10A according to each of the aforementioned embodiments, the through holes 60X may be formed at any timing as long as the timing is after the sealing resin 60 is formed. For example, immediately after the semiconductor chip 50 and the sealing resin 60 are thinned from the upper surface side, the through holes 60X may be formed to penetrate the thinned sealing resin 60 and the insulating layers 43 and 41 in the thickness direction.

In the method for manufacturing the semiconductor package 10, 10A according to each of the aforementioned embodiments, the solder resist layer 22 may be formed at any timing as long as the timing is after the lowermost wiring layer 32 is formed. For example, the solder resist layer 22 may be formed after the through electrodes 61 and the wiring layer 62 are formed.

In the aforementioned second embodiment and each of the aforementioned modifications, the semiconductor package 70, 120 is stacked and bonded on the semiconductor package 10, 10A. The present disclosure is not limited thereto. For example, an electronic component such as a semiconductor chip may be used in place of the semiconductor package 70, 120 and connected to the connection pads P3 of the semiconductor package 10, 10A. For example, chip components such as a chip capacitor, a chip resistor and a chip inductor, a crystal oscillator, etc. may be enumerated as examples of the electronic component.

The aforementioned embodiments and the aforementioned modifications may be combined suitably.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

A method of manufacturing a wiring board, the method comprising:

a) forming a structure body on a support substrate, wherein the structure body comprises:

a first insulating layer being made of an insulating resin containing a thermosetting resin as a main component;

a recess portion formed in an upper surface of the first insulating layer; and a first wiring layer formed in the recess portion and comprising an upper surface (33A) exposed from the first insulating layer, b) forming a through hole to penetrate the first insulating layer in a thickness direction thereof;

c) forming an electrically conductive layer such that the electrically conductive layer is filled in the through hole and covers the upper surface of the first insulating layer and the upper surface of the first wiring layer;

d) polishing the electrically conductive layer covering the upper surface of the first insulating layer, a portion of the upper surface of the first insulating layer, and a portion of the upper surface of the first wiring layer to form a via wiring in the through hole (30X), wherein the via wiring comprises an upper end surface exposed from the upper surface of the first insulating layer;

e) forming a second wiring layer on the upper surface of the first insulating layer to contact the upper end surface of the via wiring and the upper surface of the first wiring layer; and f) forming a second insulating layer on the upper surface of the first insulating layer to cover at least a portion of the second wiring layer,wherein the second insulating layer is made of an insulating resin containing a photosensitive resin as a main component.

2) A method of manufacturing a semiconductor package, the method comprising:

a) forming a structure body on a support substrate, wherein the structure body comprises:

a first insulating layer being made of an insulating resin containing a thermosetting resin as a main component;

a recess portion formed in an upper surface of the first insulating layer; and a first wiring layer formed in the recess portion and comprising an upper surface exposed from the first insulating layer, b) forming a through hole to penetrate the first insulating layer in a thickness direction thereof;

c) forming an electrically conductive layer such that the electrically conductive layer is filled in the through hole and covers the upper surface of the first insulating layer and the upper surface of the first wiring layer;

d) polishing the electrically conductive layer covering the upper surface of the first insulating layer, a portion of the upper surface of the first insulating layer, and a portion of the upper surface of the first wiring layer to form a via wiring in the through hole, wherein the via wiring comprises an upper end surface exposed from the upper surface of the first insulating layer;

e) forming a wiring structure on the upper surface of the first insulating layer;

f) electrically connecting an electronic component to an uppermost wiring layer of the wiring structure; and g) forming a sealing resin on an upper surface of an uppermost insulating layer of the wiring structure to seal the electronic component with the sealing resin, wherein the step (e) comprises:

forming a second wiring layer on the upper surface of the first insulating layer to contact the upper end surface of the via wiring and the upper surface of the first wiring layer; and forming a second insulating layer on the upper surface of the first insulating layer to cover at least a portion of the second wiring layer, wherein the second insulating layer is made of an insulating resin containing a photosensitive resin as a main component.

3) The method of clause (2), further comprising:

h) thinning the sealing resin and the electronic component from the upper surface sides of the sealing resin and the electronic component; and i) forming a through hole through the sealing resin and the insulating layers of the wiring structure in a thickness direction to expose at least a portion of the upper surface of the first wiring layer 4) The method of clause (2), further comprising:

j) removing the support substrate;

k) forming a third wiring layer on a lower face of the first insulating layer to contact a lower end surface of the via wiring; and l) forming an outermost insulating layer on the lower surface of the first insulating layer to cover at least a portion of the third wiring layer, wherein the outermost insulating layer is made of an insulating resin containing a photosensitive resin as a main component.

What is claimed is:

1. A wiring board comprising:

a first insulating layer which is made of an insulating resin containing a thermosetting resin as a main component;

a recess portion formed in an upper surface of the first insulating layer;

a first wiring layer formed in the recess portion and comprising an upper surface exposed from the first insulating layer;

a via wiring penetrating the first insulating layer in a thickness direction thereof and comprising an upper end surface exposed from the first insulating layer;

a second wiring layer formed on the upper surface of the first insulating layer to contact the upper end surface of the via wiring and the upper surface of the first wiring layer; and a second insulating layer which is made of an insulating resin containing a photosensitive resin as a main component and which is formed on the upper surface of the first insulating layer to cover at least a portion of the second wiring layer.

2. The wiring board of claim 1, further comprising:

a wiring structure comprising: the second wiring layer; the second insulating layer; an insulating layer which is made of an insulating resin containing a photosensitive resin as a main component; and a plurality of wiring layers;

a third wiring layer formed on a lower surface of the first insulating layer to contact a lower end surface of the via wiring; and an outermost insulating layer which is made of an insulating resin containing a photosensitive resin as a main component and which is formed on the lower surface of the first insulating layer to cover at least a portion of the third wiring layer, wherein an uppermost wiring layer of the plurality of wiring layers of the wiring structure functions as a pad configured to be connected to an electronic component.

3. A semiconductor package comprising:

a first insulating layer which is made of an insulating resin containing a thermosetting resin as a main component;

a recess portion formed in an upper surface of the first insulating layer;

a first wiring layer formed in the recess portion and comprising an upper surface exposed from the first insulating layer;

a via wiring penetrating the first insulating layer in a thickness direction thereof and comprising an upper end surface exposed from the first insulating layer;

a wiring structure formed on the upper surface of the first insulating layer;

an electronic component connected to an uppermost wiring layer of the wiring structure; and a sealing resin which seals the electronic component, wherein the wiring structure comprises:

a second wiring layer which is formed on the upper surface of the first insulating layer to contact the upper end surface of the via wiring and the upper surface of the first wiring layer; and a second insulating layer which is made of an insulating resin containing a photosensitive resin as a main component and which is formed on the upper surface of the first insulating layer to cover at least a portion of the second wiring layer.

4. The semiconductor package of claim 3, further comprising:
  a through hole penetrating the sealing resin and the wiring structure in the thickness direction to expose at least a portion of the upper surface of the first wiring layer.

5. The semiconductor package of claim 4, further comprising:
  a through electrode formed in the through hole and connected to the first wiring layer; and
  a connection pad formed on an upper surface of the sealing resin and connected to the first wiring layer through the through electrode.

6. The semiconductor package of claim 3, wherein
  the electronic component is a semiconductor chip which is flip-chip mounted on the uppermost wiring layer,
  the sealing resin is formed to cover a circuit formation surface and a side surface of the semiconductor chip and expose a back surface of the semiconductor chip on an opposite side to the circuit formation surface, and
  an upper surface of the sealing resin and the back surface of the semiconductor chip are substantially flush with each other.

7. The semiconductor package of claim 3, further comprising:
  a third wiring layer formed on a lower surface of the first insulating layer to contact a lower end surface of the via wiring; and
  an outermost insulating layer which is made of an insulating resin containing a photosensitive resin as a main component and which is formed on the lower surface of the first insulating layer to cover at least a portion of the third wiring layer, and
  wherein a coefficient of thermal expansion of the first insulating layer, a coefficient of thermal expansion of the sealing resin and a coefficient of thermal expansion of the outermost insulating layer are substantially equal to one another.

8. A semiconductor device comprising:
  the semiconductor package of claim 4; and
  another semiconductor package mounted on the semiconductor package through a connection terminal.

* * * * *